(12) United States Patent
Miyata et al.

(10) Patent No.: US 8,559,210 B2
(45) Date of Patent: Oct. 15, 2013

(54) MEMORY DEVICE

(75) Inventors: Koji Miyata, Kanagawa (JP); Wataru Otsuka, Tokyo (JP)

(73) Assignee: Sony Corporation, Tokyo (JP)

( * ) Notice: Subject to any disclaimer, the term of this patent is extended or adjusted under 35 U.S.C. 154(b) by 134 days.

(21) Appl. No.: 13/288,998

(22) Filed: Nov. 4, 2011

(65) Prior Publication Data
US 2012/0127778 A1    May 24, 2012

(30) Foreign Application Priority Data
Nov. 19, 2010 (JP) .................... 2010-259379

(51) Int. Cl.
*G11C 11/00* (2006.01)

(52) U.S. Cl.
USPC ........................... 365/148; 365/163

(58) Field of Classification Search
USPC ........................ 365/148, 163, 158
See application file for complete search history.

(56) References Cited

U.S. PATENT DOCUMENTS 6,992,342 B2 * 1/2006 Motoyoshi et al. ........... 257/295

OTHER PUBLICATIONS

Changhyun Cho et al; A 6F2 DRAM Technology in 60nm era for Gigabit Densities; 2005 Symposium on VLSI Technology Digest of Technical Papers; p. 36-37.
Y. K. Park et al.; Fully Integrated 56 nm DRAM Technology for 1 Gb DRAM; 2007 Symposium on VLSI Technology Digest of Technical Papers; p. 190-191.

* cited by examiner

*Primary Examiner* — Huan Hoang
(74) *Attorney, Agent, or Firm* — Dentons US LLP

(57) ABSTRACT

A memory device includes: a transistor array having transistors; and memory elements provided, one for each of the transistors. The transistor array includes a substrate having diffusion layers on a surface thereof, parallel word lines on the substrate, parallel first bit lines provided in a direction perpendicular to the word lines, bit contact electrodes between the adjacent two word lines and connecting the first bit lines and the diffusion layers, and node contact electrodes at an opposite side to the bit contact electrodes with the two word lines in between and connected to the diffusion layers. The memory elements have lower electrodes connected to the node contact electrodes, memory layers on the lower electrodes and having resistance values reversibly changing by voltage application, and parallel second bit lines extending in the same direction as that of the first bit lines on the memory layers.

16 Claims, 20 Drawing Sheets

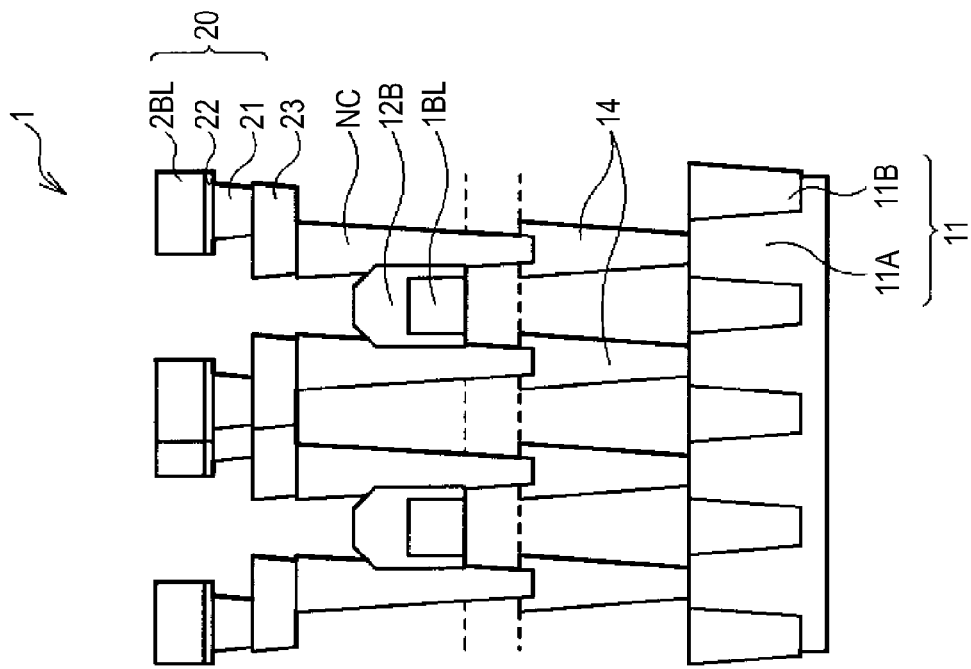
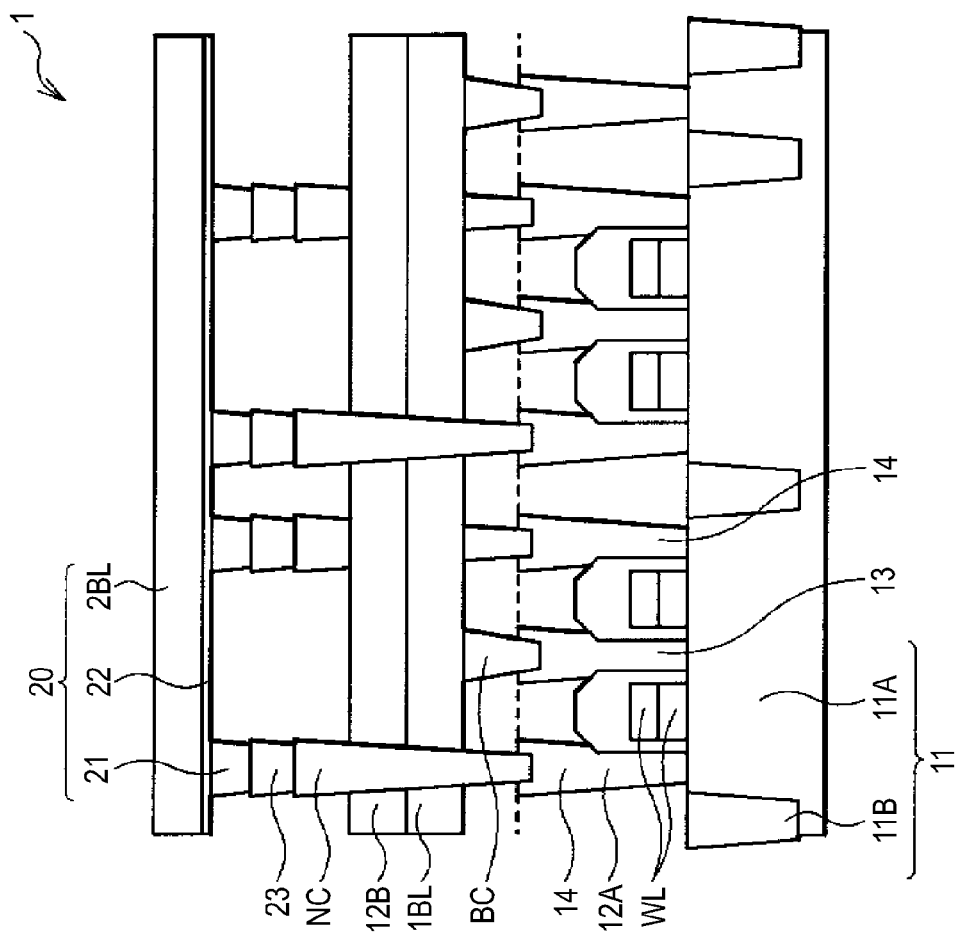

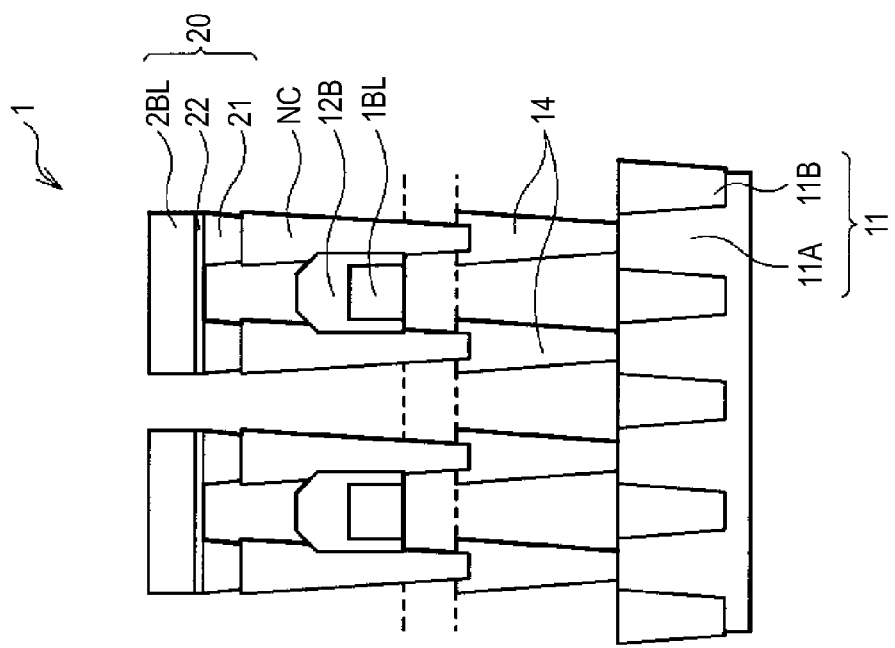
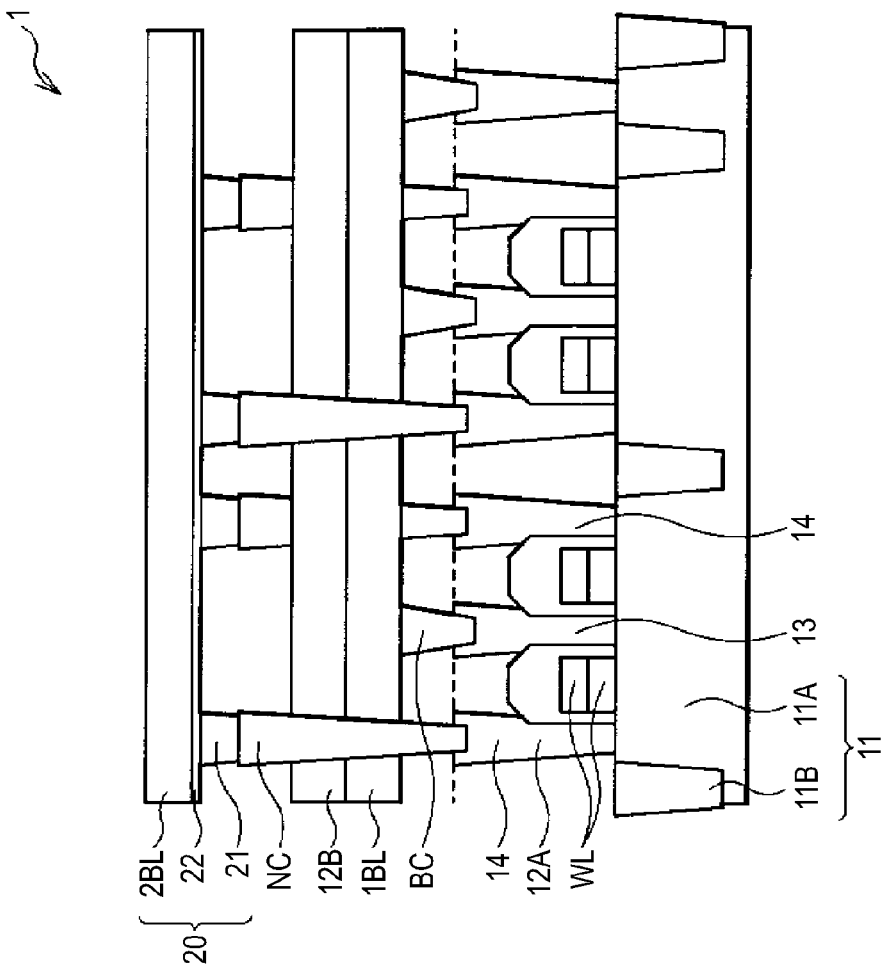

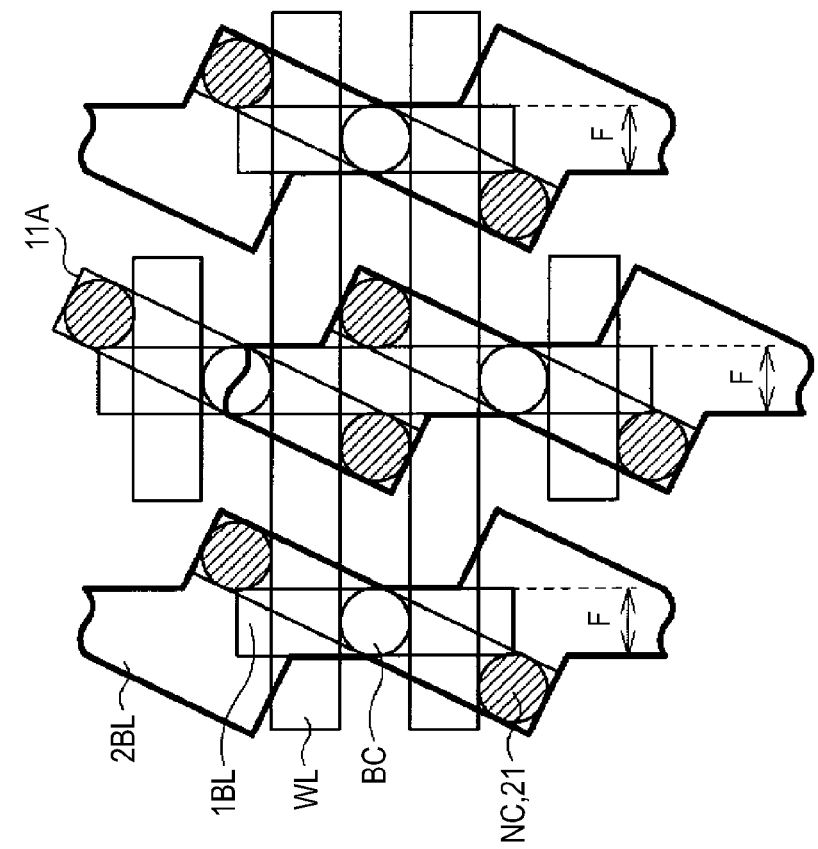
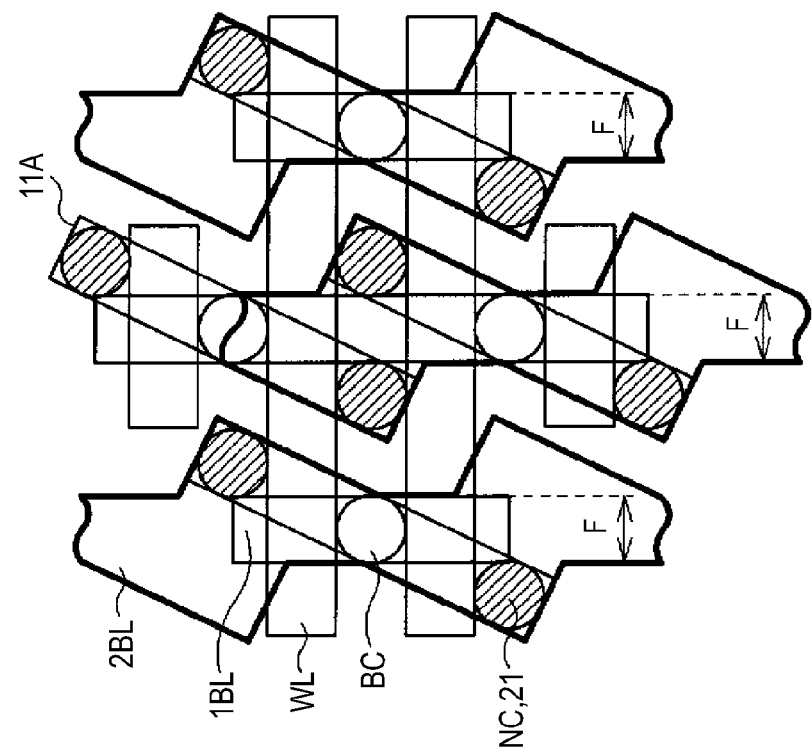

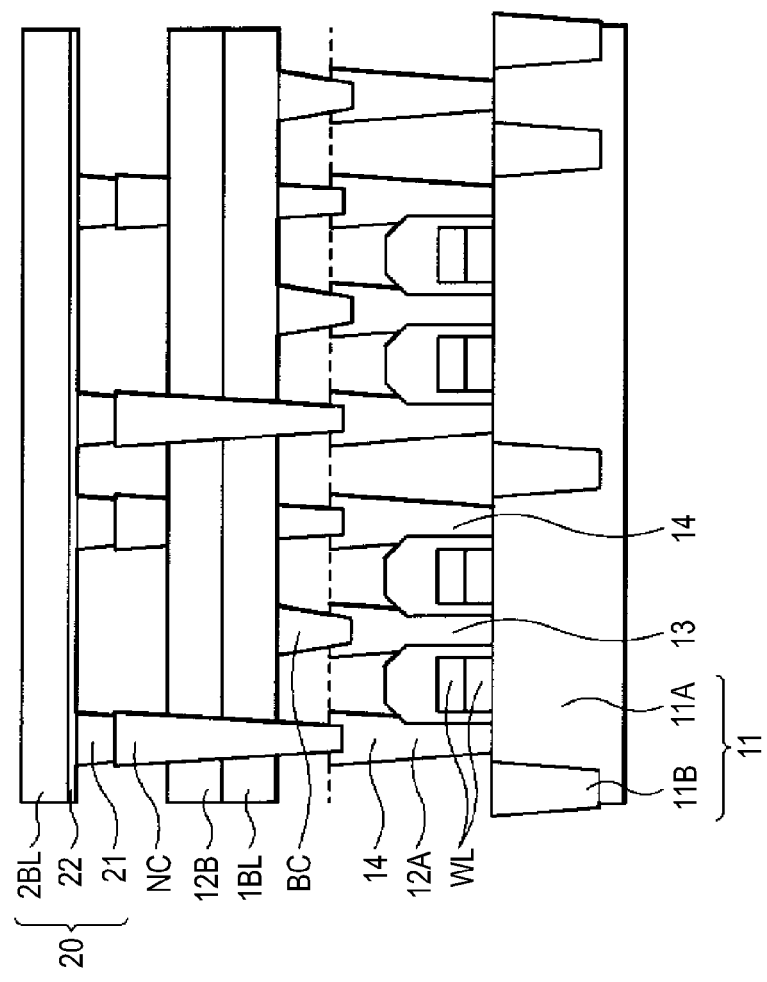
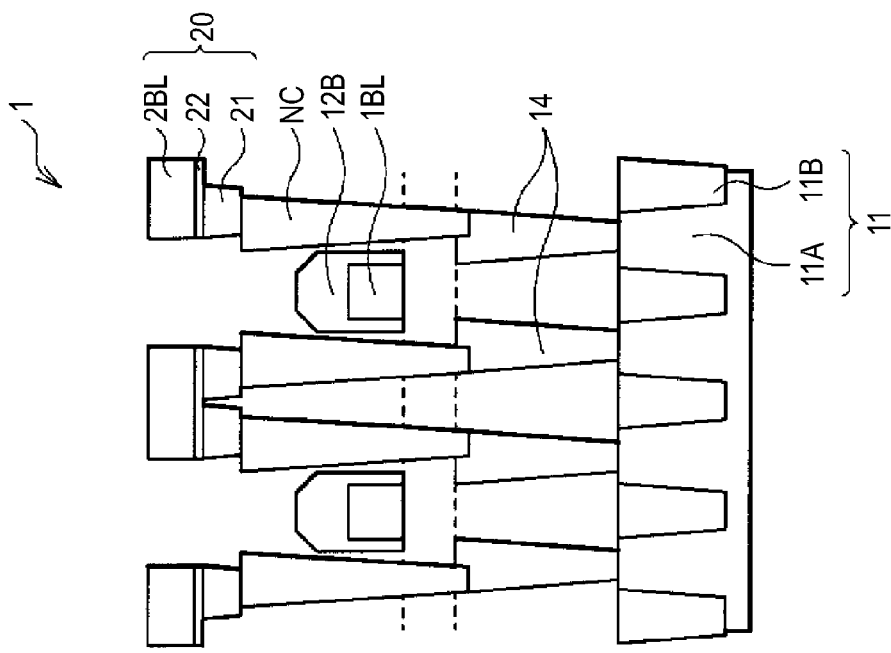
FIG. 9A
FIG. 9B

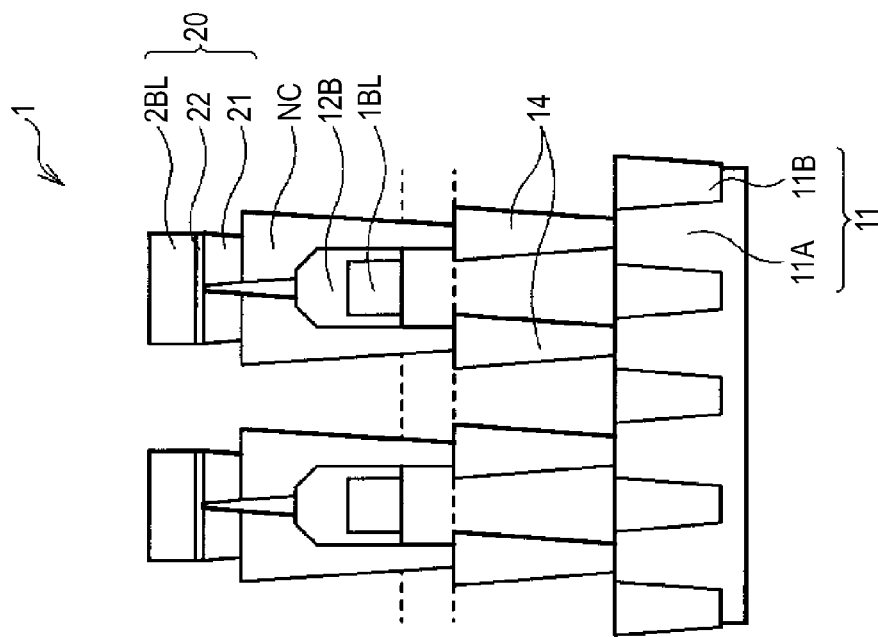
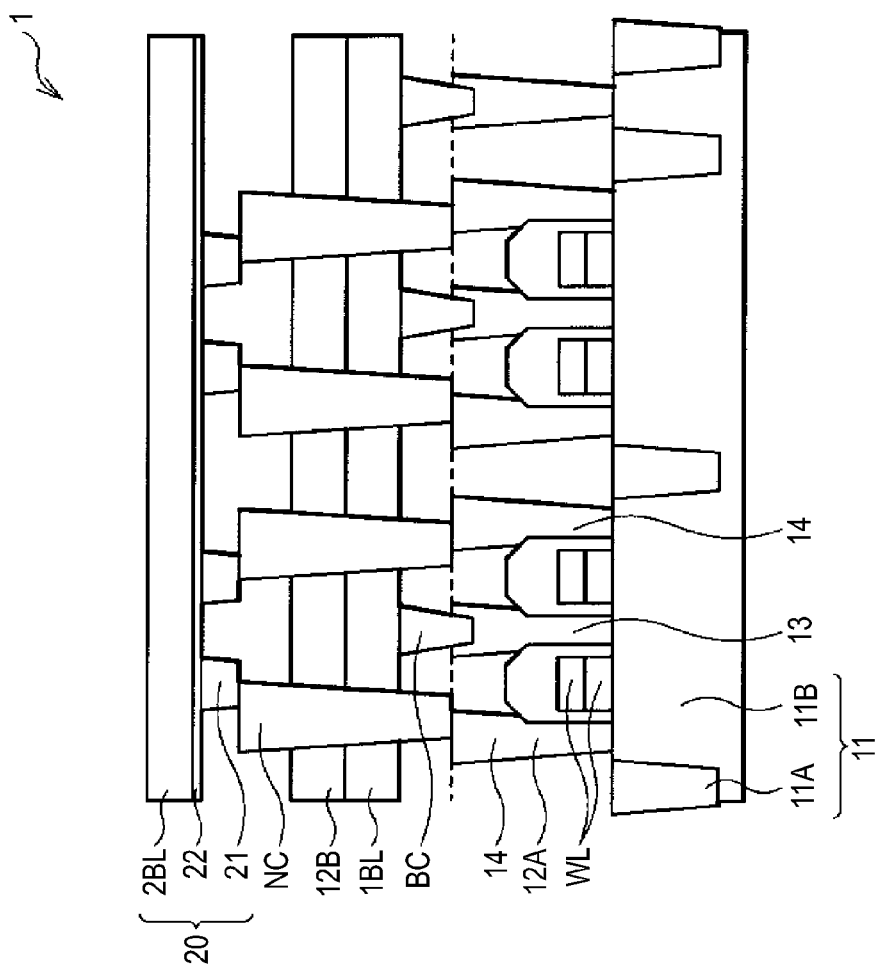

MEMORY DEVICE

FIELD

The present disclosure relates to a memory device including memory elements that can store information by changes of electric characteristics of resistance-change layers.

BACKGROUND

As a method of forming a transistor array with the highest density based on the minimum design rule F, a memory cell of DRAM (Dynamic Random Access Memory) is known (for example, see Non-Patent Document 1 (Y. K. Park, and 23 others, "Fully Integrated 56 nm DRAM Technology for 1 Gb DRAM", "2007 Symposium on VLSI Technology Digest of Technical Papers", pp. 190-191) and Non-Patent Document 2 (Changhyun Cho and 12 others, "A 6 F2 DRAM Technology in 60 nm era for Gigabit Densities", "2005 Symposium on VLSI Technology Digest of Technical Papers", pp. 36-37)). In the structure in related art, one transistor may be formed to have an area of $6F^2$ and the smallest cell area may be achieved as a planar transistor.

SUMMARY

On the other hand, recently, developments of forming a 1T1R-type (having one memory element for one transistor) nonvolatile memory by combining the so-called bipolar resistance-change memory element that records low-resistance and high-resistance states by directions in which currents flow and a transistor array have been actively conducted. However, in the case of the resistance-change memory element, it is not necessarily easy to apply the DRAM transistor arrays in related art described in Non-Patent Document 1 and Non-Patent Document 2 without change. This is because there are bit lines (BL) of DRAM, one for each column. In the DRAM, a plate electrode potential common to the entire memory array is fixed to Vc/2 and the BL potential is operated to Vc or GND, and thereby, a logical value is recorded. That is, in the DRAM the potential difference of ±Vc/2 is enough for operation of the memory array. On the other hand, in the resistance-change memory element, a write voltage of at least about 2V is necessary, and a voltage of +Vc or −Vc is provided to the memory array using the second bit line (BL2) in place of the plate electrode to complementarily change both potentials of the first bit line (BL1) and the second bit line (BL2) corresponding to the bit lines of the DRAM to Vc or GND. As described above, the resistance-change memory element is largely different in cell configuration and operation from the DRAM in related art, and it has been impossible to realize higher density and larger capacity by simple application of the transistor array of the DRAM in related art.

Thus, it is desirable to provide a memory device that can realize higher density and larger capacity.

A memory device according to one embodiment of the present disclosure includes a transistor array having plural transistors, and plural memory elements provided, one for each of the plural transistors. The transistor array includes a substrate having diffusion layers of the plural transistors on a surface thereof, plural parallel word lines on the substrate, plural parallel first bit lines provided in a direction perpendicular to the word lines, bit contact electrodes provided between the adjacent two word lines and connecting the first bit lines and the diffusion layers, and node contact electrodes provided at an opposite side to the bit contact electrodes with the respective adjacent two word lines in between and connected to the diffusion layers. The plural memory elements have lower electrodes connected to the node contact electrodes and provided with respect to each of the plural memory elements in positions shifted from immediate above the node contact electrodes closer to the bit contact electrode within a plane in parallel to the surface of the substrate, memory layers provided on the lower electrodes and having resistance values reversibly changing by voltage application, and plural parallel second bit lines extending in the same direction as that of the first bit lines on the memory layers, and the respective plural second bit lines are superimposed on the lower electrodes connected to the node contact electrodes at one sides or both sides of the first bit lines.

A memory device according to another embodiment of the present disclosure includes a transistor array having plural transistors, and plural memory elements provided, one for each of the plural transistors. The transistor array includes a substrate having diffusion layers of the plural transistors on a surface thereof, plural parallel word lines on the substrate, plural parallel first bit lines provided in a direction perpendicular to the word lines, bit contact electrodes provided between the adjacent two word lines and connecting the first bit lines and the diffusion layers, and node contact electrodes provided at an opposite side to the bit contact electrodes with the respective adjacent two word lines in between and connected to the diffusion layers. The plural memory elements have lower electrodes connected to the node contact electrodes and provided with respect to each of the plural memory elements, memory layers provided on the lower electrodes and having resistance values reversibly changing by voltage application, and plural parallel second bit lines extending in the same direction as that of the first bit lines on the memory layers, and the respective plural second bit lines are superimposed on the lower electrodes connected to the node contact electrodes located between the adjacent two first bit lines.

A memory device according to still another embodiment of the present disclosure includes a transistor array having plural transistors, and plural memory elements provided, one for each of the plural transistors. The transistor array includes a substrate having diffusion layers of the plural transistors on a surface thereof, plural parallel word lines on the substrate, plural parallel first bit lines provided in a direction perpendicular to the word lines, bit contact electrodes provided between the adjacent two word lines and connecting the first bit lines and the diffusion layers, and node contact electrodes provided at an opposite side to the bit contact electrode with the respective adjacent two word lines in between and connected to the diffusion layers. The plural memory elements have lower electrodes connected to the node contact electrodes and provided with respect to each of the plural memory elements, memory layers provided on the lower electrodes and having resistance values reversibly changing by voltage application, and plural parallel second bit lines extending in the same direction as that of the first bit lines on the memory layers, and the respective plural second bit lines are superimposed on the lower electrodes connected to the node contact electrodes located between the first bit lines at both ends of the adjacent three first bit lines.

In the memory devices of the embodiments of the present disclosure, by complementarily changing both potentials of the first bit lines and the second bit lines to Vc or GND, voltages of +Vc or −Vc are applied between the lower electrodes of the memory elements and the second bit lines. Thereby, the resistance values of the memory layers become lower (low-resistance state; writing state) or higher (high-resistance state; erasing state).

Note that the correspondences of the writing operation and the erase operation to the lower resistance and the higher resistance depend on definitions, and the low-resistance state is defined as the writing state and the high-resistance state is defined as the erasing state in this specification.

According to the memory device of the one embodiment of the present disclosure, since the lower electrodes are provided in the positions shifted from immediate above the node contact electrodes closer to the bit contact electrodes within the plane in parallel to the surface of the substrate, the distance between the second bit lines may be made wider without changing the high-density arrangement configuration of the transistor array. Thus, higher density and large capacity can be realized.

According to the memory device of the another embodiment of the present disclosure, since the respective plural second bit lines are superimposed on the lower electrodes connected to the node contact electrodes located between the adjacent two first bit lines, the distance between the second bit lines may be made wider without changing the high-density arrangement configuration of the transistor array. Thus, higher density and large capacity can be realized.

According to the memory device of the still another embodiment of the present disclosure, since the respective plural second bit lines are superimposed on the lower electrodes connected to the node contact electrodes located between the first bit lines at both ends of three adjacent first bit lines, the distance between the second bit lines may be made wider without changing the high-density arrangement configuration of the transistor array. Thus, higher density and large capacity can be realized.

BRIEF DESCRIPTION OF THE DRAWINGS

FIGS. 2A and 2B are side views showing the configuration of the memory device shown in FIG. 1 seen from IIA direction and IIB direction.

FIGS. 6A and 6B are side views showing the configuration of the memory device shown in FIG. 5 seen from VIA direction and VIB direction.

FIGS. 7A and 7B are plan views for explanation of problems of the reference example shown in FIG. 5.

FIGS. 9A and 9B are side views showing a configuration of a memory device according to modified example 1.

FIGS. 10A and 10B are side views showing a configuration of a memory device according to modified example 2.

DETAILED DESCRIPTION

As below, embodiments of the present disclosure will be explained in detail with reference to the drawings. The explanation will be made in the following order.

1. First Embodiment (Example with lower electrodes shifted in bit contact electrode direction and respective second bit lines superimposed on lower electrodes at both sides of first bit lines)

2. Modified Example 1 (Example with connection plugs in enlarged diameter)

3. Modified Example 2 (Example with node contact electrodes, connection plugs, and lower electrodes slightly shifted)

4. Second Embodiment (Example with lower electrodes shifted in bit electrode direction and arranged in lines)

5. Third Embodiment (Example with respective second bit lines superimposed on lower electrodes connected to node contact electrodes located between adjacent two first bit lines)

6. Fourth Embodiment (Example with lower electrodes shifted and arranged in lines)

7. Fifth Embodiment (Example with respective second bit lines superimposed on lower electrodes connected to node contact electrodes located between first bit lines at both ends of adjacent three first bit lines)

8. Sixth Embodiment (Example with lower electrodes shifted and arranged in two lines)

9. Seventh Embodiment (Example of PCM)

10. Eighth Embodiment (Example of ReRAM)

(First Embodiment)

Figure 1:
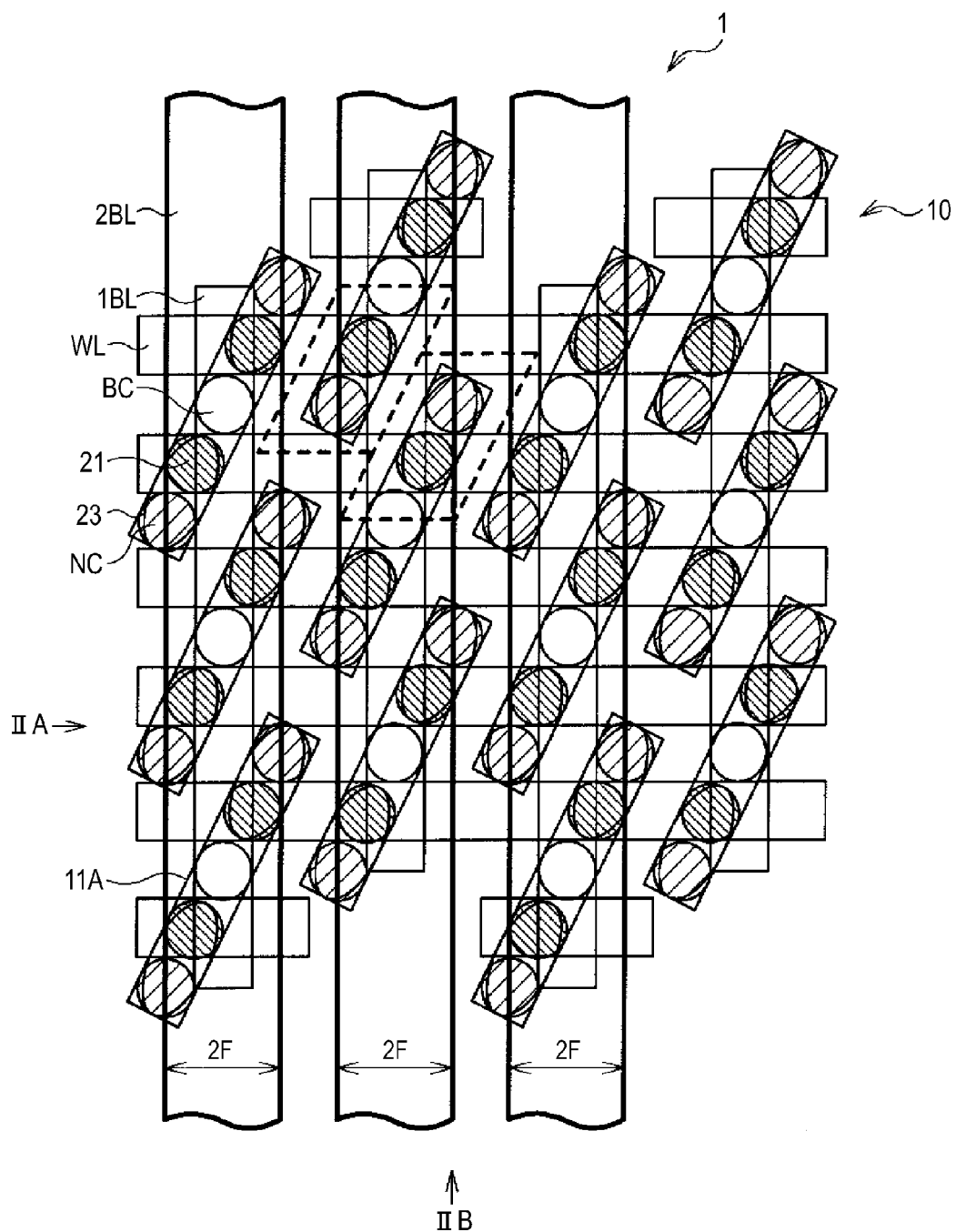
FIG. 1 is a plan view showing a configuration of a memory device according to a first embodiment of the present disclosure.

FIG. 1 shows a planar configuration of a memory device according to the first embodiment of the present disclosure, and FIGS. 2A and 2B show the configuration of the memory device shown in FIG. 1 seen from IIA direction and IIB direction. The memory device 1 has plural memory elements 20 on a transistor array 10 with plural transistors.

The transistor array 10 has plural parallel word lines WL and plural parallel first bit lines 1BL on a substrate 11, for example. The substrate 11 includes a silicon (Si) substrate, for example, and diffusion layers (active regions) 11A of the transistors are provided on the surface thereof. The diffusion layers 11A are isolated from each other by element isolation layers 11B. The word lines WL also serve as gates of the transistors and provided in the lateral direction in FIG. 1, for example, on the substrate 11. The upper surfaces and the side surfaces of the word lines WL are covered by insulating layers 12A. The first bit lines 1BL are provided in the direction perpendicular to the word lines WL, in the longitudinal direction in FIG. 1, for example. The upper surfaces and the side surfaces of the first bit lines 1BL are covered by insulating layers 12B. Note that the widths of the word lines WL and the first bit lines 1BL are equal to the minimum design rule (process limitation by photolithography) F, and the pitch of the first bit lines 1BL is three times the minimum design rule F (3F) and the pitch of the word lines WL is twice the minimum design rule F (2F).

Bit contact electrodes BC are provided between the adjacent two word lines WL. The bit contact electrodes BC connect the first bit lines 1BL and the diffusion layers 11A, and also serve as ones of sources or drains of the transistors. Connection plugs 13 are provided between the bit contact electrodes BC and the diffusion layers 11A.

Node contact electrodes NC are provided at the opposite side to the bit contact electrodes BC with the respective two adjacent word lines WL sandwiching the bit contact electrodes BC in between. The node contact electrodes NC connect lower electrodes 21, which will be described later, and the diffusion layers 11A, and also serve as the others of sources or drains of the transistors. Connection plugs 14 are provided between the node contact electrodes NC and the diffusion layers 11A.

The bit contact electrodes BC are shared between the adjacent two transistors and the node contact electrodes NC are provided, one for each transistor. Therefore, one transistor has a parallelogram region containing a half of one bit contact electrode BC and one node contact electrode NC as schematically shown by a dotted line in FIG. 1. An area per transistor is $6F^2$, and the transistors are arranged with extremely high density.

The memory elements 20 are provided, one for each of the plural transistors of the transistor array 10, and each has a configuration in which a lower electrode 21, a memory layer 22, and a second bit line 2BL are sequentially arranged from the side of the transistor array 10, for example.

The lower electrodes 21 are provided, one for each of the plural transistors of the transistor array 10, and connected to the node contact electrodes NC via connection layers 23. The lower electrodes 21 include wiring materials used for the semiconductor process, for example, W (tungsten), WN (tungsten nitride), titanium nitride (TiN), and tantalum nitride (TaN).

Figure 3:
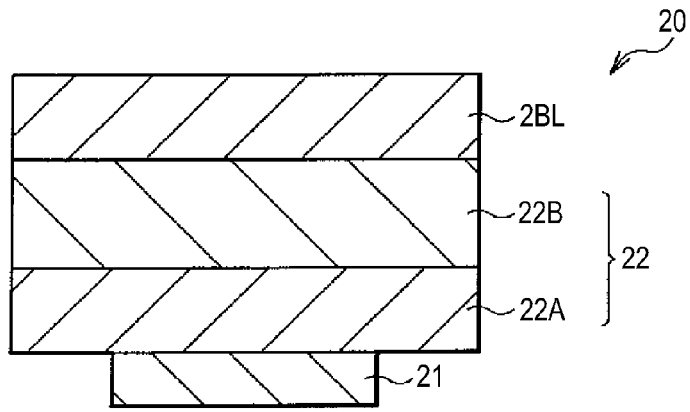
FIG. 3 is a sectional view showing an example of a memory layer shown in FIGS. 2A and 2B.

FIG. 3 shows an example of the memory layer 22. The memory layer 22 has a resistance value reversibly changing by voltage application, and has a configuration in which a resistance-change layer 22A and an ion source layer 22B are sequentially stacked in this order from the side of the lower electrode 21, for example.

The ion source layer 22B contains at least one kind of chalcogen elements of tellurium (Te), sulfur (S), and selenium (Se) as an ion conduction material that is negatively ionized. Further, the ion source layer 22B contains zirconium (Zr) and/or copper (Cu) as a metal element that can be positively ionized, and further contains aluminum (Al) and/or germanium (Ge) as an element that forms an oxide at erasing. Specifically, the ion source layer 22B includes anion source layer material having a composition of ZrTeAl, ZrTeAlGe, CuZrTeAl, CuTeGe, CuSiGe, or the like, for example. Note that the ion source layer 22B may contain another element than those described as above, for example, silicon (Si).

The resistance-change layer 22A has a function of stabilizing information retention characteristics as a barrier on electric conduction, and includes a material having a higher resistance value than that of the ion source layer 22B. As the constituent material of the resistance-change layer 22A, for example, preferably, an oxide or nitride containing at least one kind of rare earth elements such as Gd (gadolinium), Al, Mg (magnesium), Ta, Si (silicon) and Cu.

The second bit lines 2BL shown in FIGS. 1 and 2A and 2B have a function as upper electrodes corresponding to the lower electrode 21, and are provided as plural parallel linear electrodes extending in the same direction as that of the first bit lines 1BL. The second bit lines 2BL include a known wiring material used for the semiconductor process like the lower electrodes 21.

Figure 4:
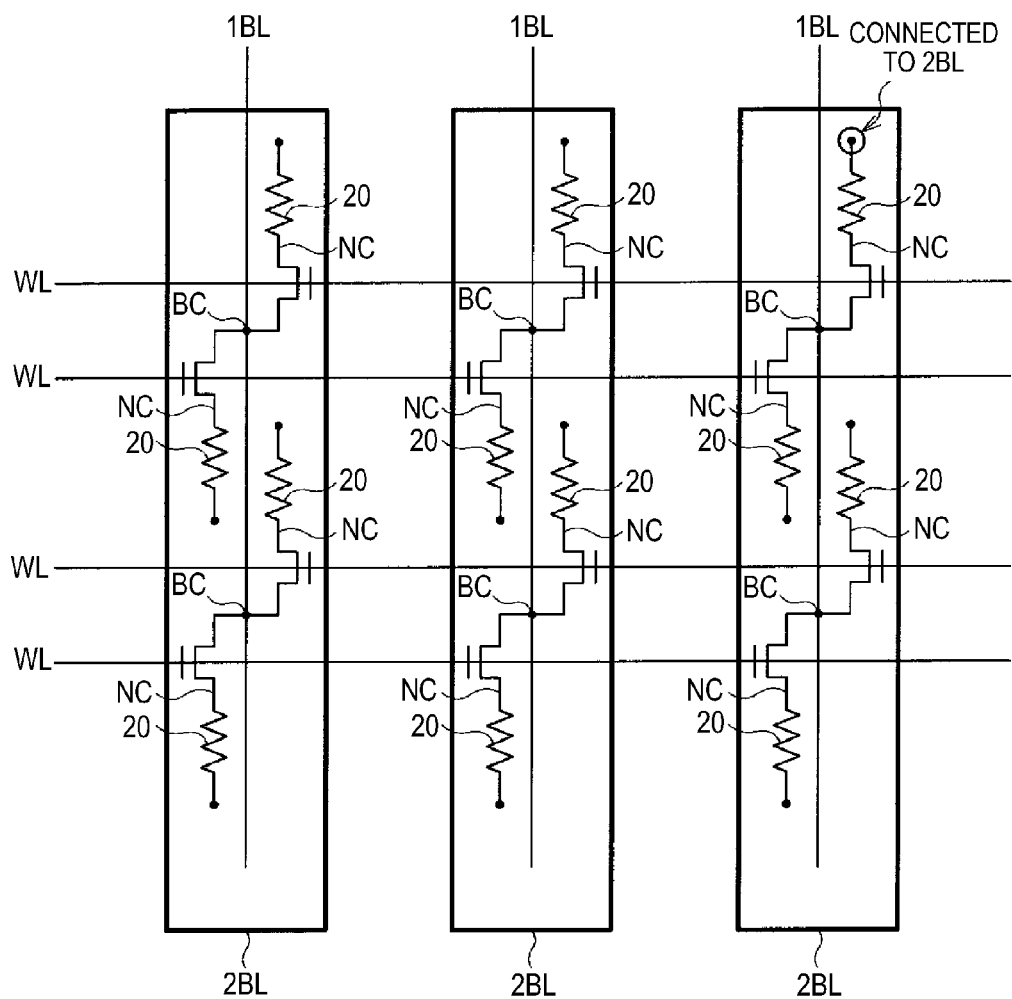
FIG. 4 is an equivalent circuit diagram of the memory device shown in FIG. 1.

FIG. 4 shows an equivalent circuit of the memory device 1. Two transistors are connected to the first bit lines 1BL with the bit contact electrodes BC in between. The word lines WL are connected to the gates of the transistors, the bit contact electrodes BC are connected to ones of the sources or drains of the transistors, and the memory layers 22 and the second bit lines 2BL are connected to the others of the sources or drains of the transistors via the node contact electrodes NC and the lower electrodes 21 (see FIGS. 1 and 2A and 2B).

The lower electrodes 21 are provided in positions shifted from immediate above the node contact electrodes NC closer to the bit contact electrodes BC within a plane in parallel to the surface of the substrate 11 as shown in FIGS. 1 and 2A and 2B. The respective plural second bit lines 2BL are superimposed on the lower electrodes 21 connected to the node contact electrodes NC at both sides of the first bit lines 1BL. Thereby, in the memory device 1, higher density and larger capacity can be realized.

Figure 5:
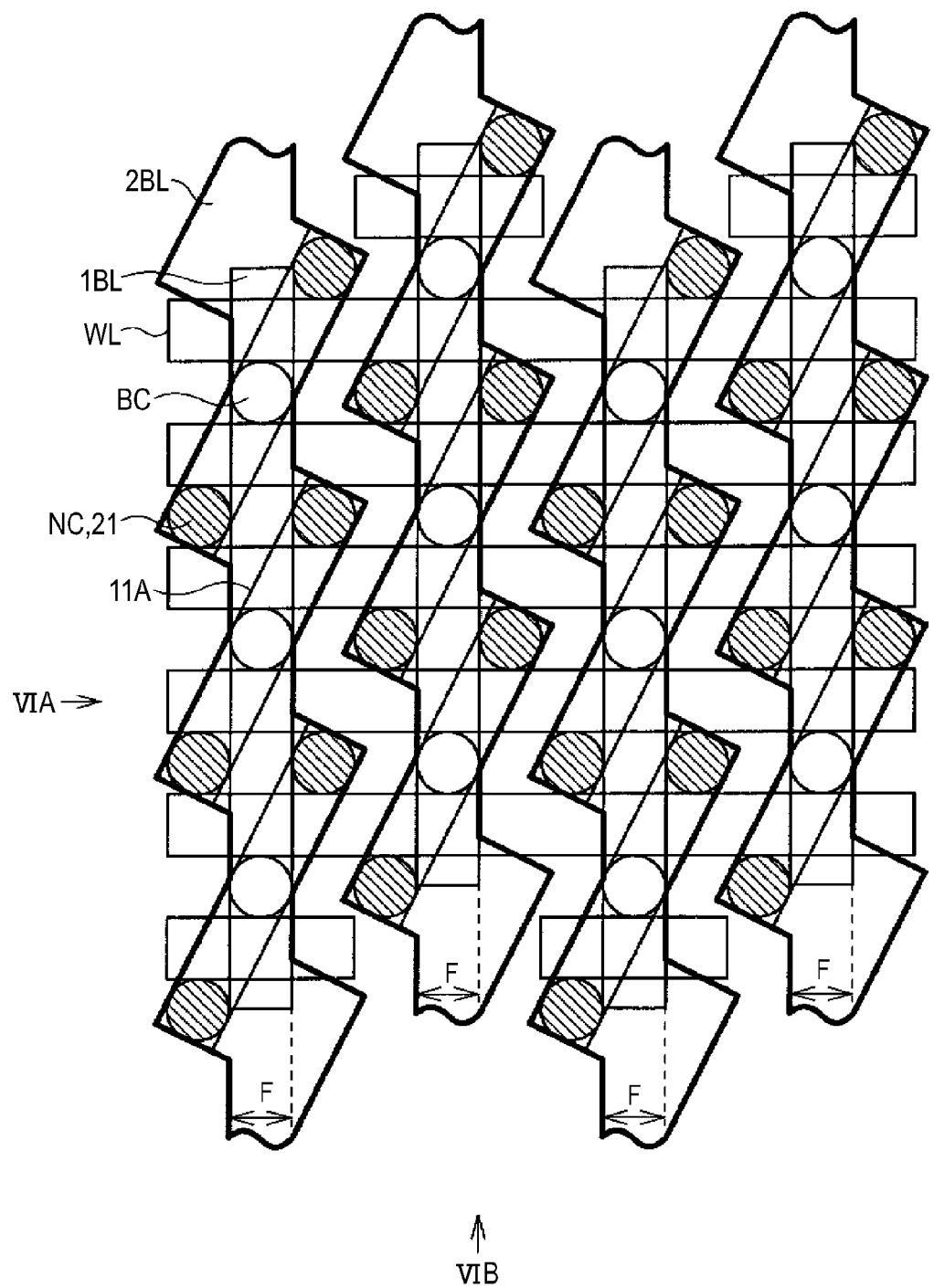
FIG. 5 is a plan view showing a configuration of a memory device according to a reference example of the present disclosure.

FIGS. 5 and 6A and 6B show the case where the lower electrodes 21 are not shifted but provided directly on the node contact electrodes NC. The node contact electrodes NC are not arranged in a lattice pattern. This is because the transistor array 10 is formed only in consideration of arrangement of transistors with the highest density in the DRAM that originally has no second bit lines 2BL, and the node contact electrodes NC are arranged not with consideration of the second bit lines 2BL. Accordingly, if the respective second bit lines 2BL are arranged to be superimposed on the lower electrodes 21 connected to the node contact electrodes NC at both sides of the first bit lines 1BL, the shapes of the second bit lines 2BL are distorted. Further, the distance between the adjacent second bit lines 2BL may become narrower than the minimum design rule F in part, and the realization is difficult.

On this account, it is conceivable that the parts in which the distance between the adjacent second bit lines 2BL becomes narrower than the minimum design rule F are made wider to the minimum design rule F as shown in FIG. 7B. However, in this case, the area per transistor becomes larger than $6F^2$, and reduction in added value and rise in cost of the memory device may be caused.

Figure 8A:
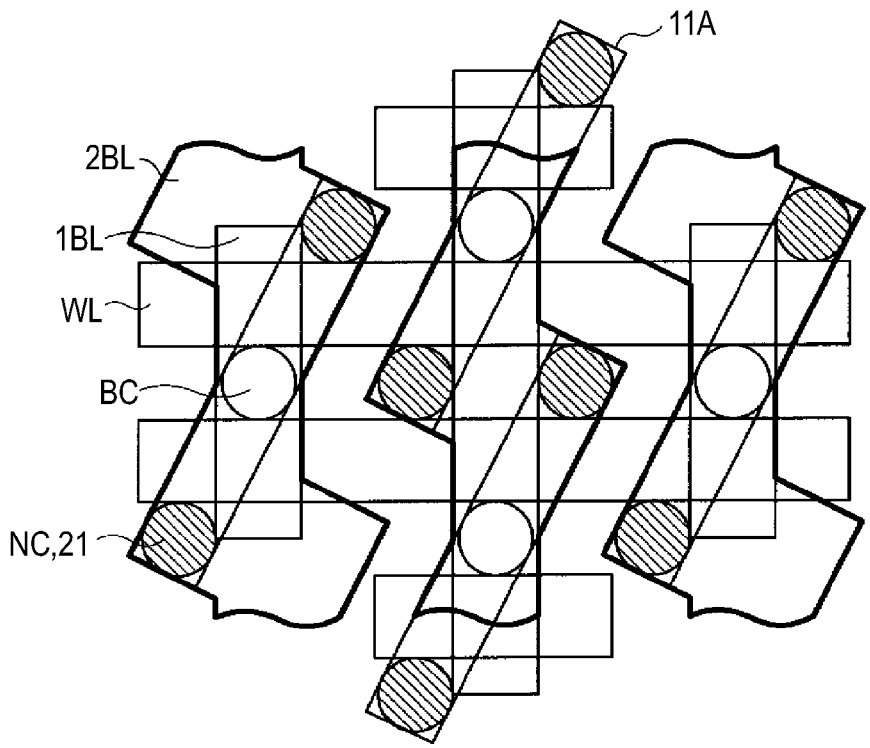
FIGS. 8A and 8B are plan views for explanation of directions in which lower electrodes are shifted.

On the other hand, in the embodiment, as shown by arrow A1 in FIG. 8A, the lower electrodes are shifted from immediate above the node contact electrodes NC closer to the bit contact electrodes BC within the plane in parallel to the surface of the substrate 11. Thereby, the lower electrodes 21 are arranged to form lines near the first bit lines 1BL and the shapes of the second bit lines 2BL are simplified. Therefore, the second bit lines 2BL can be provided with the area per transistor of $6F^2$ kept. It is desirable that the amounts of shifts of the lower electrodes 21 enable the second bit lines 2BL to be superimposed on the entire upper surfaces of the lower electrodes 21 in a range without interference with the adjacent cells.

Figure 8B:
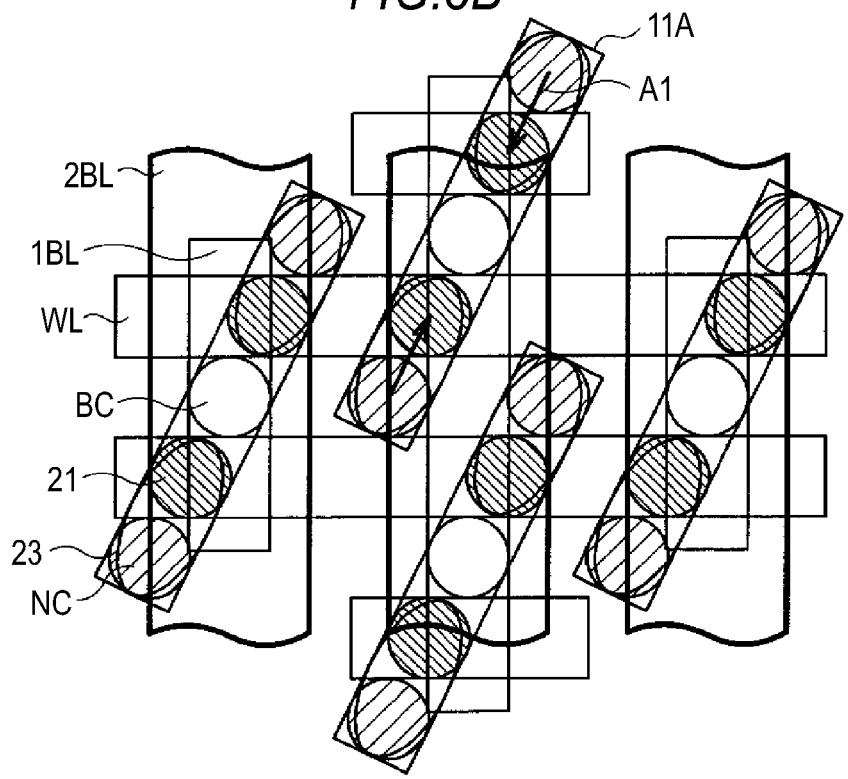

Further, in the memory device 1, the contact parts between the lower electrodes 21 and the memory layers 22 and the second bit lines 2BL have a function as the memory elements 20, and the second bit lines 2BL are borderless with respect to the lower electrodes 21. Accordingly, there has been a problem that the device sizes easily vary due to amounts misalignment in lithography. However, the width of the second bit lines 2BL shown in FIG. 8B is twice the minimum design rule F (2F), and the distance between the adjacent second bit lines 2BL is equal to the minimum design rule F. Therefore, the distance between the adjacent second bit lines 2BL becomes larger and the second bit lines 2BL can be provided with room relative to the lower electrodes 21. Thus, even when the misalignment occurs in lithography between the lower electrodes 21 and the second bit lines 2BL, the device sizes are hard to be affected and the memory devices can be stably mass-produced.

The connection layers 23 shown in FIGS. 1 and 2A and 2B are provided between the upper surfaces of the node contact electrodes NC and the lower surfaces of the lower electrodes 21 and have shapes that can absorb the amounts of shifts between the node contact electrodes NC and the lower electrodes 21. By adding the connection layers 23, the lower electrodes 21 can be shifted in desired amounts in a simple configuration and manufacturing process, and reliable electrical connections between the lower electrodes 21 and the node contact electrodes NC can be made.

The memory device 1 maybe manufactured in the following manner, for example.

First, as shown in FIGS. 1 and 2A and 2B, the transistor array 10 including the word lines WL, the insulating layers 12, the connection plugs 13, 14, the first bit lines 1BL, the bit contact electrodes BC, and the node contact electrodes NC on the substrate 11 of silicon is formed.

Then, as shown in FIGS. 2A and 2B, the connection layers 23 are formed on the node contact electrodes NC and the lower electrodes 21 of titanium nitride (TiN), for example, are formed on the connection layers 23. In this regard, the lower electrodes 21 are provided in positions shifted from immediate above the node contact electrodes NC closer to the bit contact electrodes BC within the plane in parallel to the surface of the substrate 11 as shown in FIGS. 1 and 2A and 2B and 8A.

Subsequently, a gadolinium (Gd) film is formed in a thickness of 1.0 nm by sputtering, for example. Then, by oxidizing the gadolinium (Gd) film using oxygen plasma, a resistance-change layer material film (not shown) of gadolinium oxide (GdOx) is formed.

Then, an ion source layer material film (not shown) of CuZrTeAl is formed in a thickness of 60 nm by sputtering, for example.

After the resistance-change layer material film and the ion source layer material film are formed, a second bit line material film of tungsten (W), for example, is deposited on the ion source layer material film. Then, a laminated film of the resistance-change layer material film, the ion source layer material film, and the second bit line material film is patterned by plasma etching or the like, and thereby, the second bit lines 2BL and the memory layers 22 including the resistance-change layers 22A and the ion source layers 22B are formed. In addition to plasma etching, known methods of ion milling, RIE (Reaction Ion Etching), etc. may be used for patterning.

Then, the laminated film is heat treated. In this manner, the memory device 1 shown in FIGS. 1 and 2A and 2B is completed.

In the memory device 1, both potentials of the first bit lines 1BL and the second bit lines 2BL are complementarily changed to Vc or GND, and the voltages of +Vc or −Vc are applied from a power supply (pulse applying means, not shown) between the lower electrodes 21 of the memory elements 20 and the second bit lines 2BL and the electrical properties of the memory layers 22, for example, the resistance values change, and thereby, writing, erasing, and reading of information are performed. As below, their operations will be specifically explained.

First, positive voltages are applied to the memory elements 20 so that the second bit lines 2BL may be at positive potentials, for example, and the lower electrodes 21 side may be at negative potentials. Thereby, in the memory layers 22, cations of Cu and/or Zr, for example, are ionically conducted from the ion source layers 22B, coupled to electrons and precipitated at the lower electrodes 21 side, and, as a result, conducting paths (filaments) of Zr and/or Cu having low resistance reduced to metal states are formed on the interfaces between the lower electrodes 21 and the resistance-change layers 22A. Alternatively, the conducting paths are formed in the resistance-change layers 22A. Therefore, the resistance values of the resistance-change layers 22A become lower and turns from the high-resistance state as the initial state to the low-resistance state.

Then, the low-resistance state is held if the positive voltages are removed to eliminate the voltages applied to the memory elements 20. That is, information has been written. In the case where the embodiment is used for a memory device that can be written only once, so-called PROM (Programmable Read Only Memory), recording is completed in the above described recording process only.

On the other hand, for application to a memory device that can be erased, i.e., RAM (Random Access Memory), EEPROM (Electrically Erasable and Programmable Read Only Memory), or the like, an erasing process is necessary. In the erasing process, negative voltages are applied to the memory elements 20 so that the second bit lines 2BL may be at negative potentials, for example, and the lower electrodes 21 side may be at positive potentials. Thereby, Zr and/or Cu of the conducting paths that have been formed within the resistance-change layers 22A are oxidized and ionized, and dissolved in the ion source layers 22B or coupled to Te or the like to form compounds of Cu2Te, CuTe, etc. Then, the conducting paths of Zr and/or Cu disappear or decrease and the resistance values become higher. Alternatively, additive elements of Al, Ge, etc. existing in the ion source layers 22B further form oxide films on the anode poles and the layers turn to the high-resistance state.

Then, the state with the high resistance value is held if the negative voltages are removed to eliminate the voltages applied to the memory elements 20. Thereby, the written information can be erased. By repeating the processes, writing of information in the memory elements 20 and erasing of the written information may be repeatedly performed.

Further, for example, in the respective correspondences of the state with the high resistance value to information of "0" and the state with the low resistance value to information of "1", the information may be changed from "0" to "1" in the recording process of information by application of positive voltages and may be changed from "1" to "0" in the erasing process of information by application of negative voltages.

To demodulate recording data, it is more preferable that a ratio of the initial resistance value to the resistance value after recording is larger. Note that, when the resistance value of the resistance-change layer is too large, writing, i.e., reducing resistance is difficult and the writing threshold voltage is too large, and thus, it is desirable that the initial resistance value is equal to or less than 1 GΩ. When the resistance value of the resistance-change layer 22A includes an oxide of a rare-earth element, the layer can be controlled by its thickness or an amount of oxygen content.

The correspondences of the writing operation and the erase operation to the lower resistance and the higher resistance depend on definitions, and the low-resistance state is defined as the writing state and the high-resistance state is defined as the erasing state in this specification.

As described above, in the embodiment, since the lower electrodes 21 are provided in positions shifted from immediate above the node contact electrodes NC closer to the bit contact electrodes BC within the plane in parallel to the surface of the substrate 11, the distance between the second bit lines 2BL can be made wider without changing the high-density arrangement configuration of the transistor array 10. Therefore, the sizes of the transistors and the memory elements 20 are reduced and many bits are provided in the limited area, and thereby, the high-capacity memory device 1 can be realized. Further, the cost per bit can be reduced. Furthermore, random access can be realized and the performance of the memory device 1 can be improved.

MODIFIED EXAMPLE 1

In the embodiment, the case where the connection layers 23 having shapes that can absorb the amounts of shifts between the node contact electrodes NC and the lower electrodes 21 are provided between the node contact electrodes NC and the lower electrodes 21 has been explained, however, as shown in FIGS. 9A and 9B, the connection plugs 14, the node contact electrodes NC, and the lower electrodes 21 may be sequentially shifted and stacked from the connection plugs 14 toward the lower electrodes 21 side.

MODIFIED EXAMPLE 2

Further, as shown in FIGS. 10A and 10B, the node contact electrodes NC may have a larger diameter than that of the connection plugs 14. The diameter of the node contact electrodes NC is set to a diameter that can contact both the upper surfaces of the connection plugs 14 and the lower surfaces of the lower electrodes 21.
(Second Embodiment)

Figure 11:
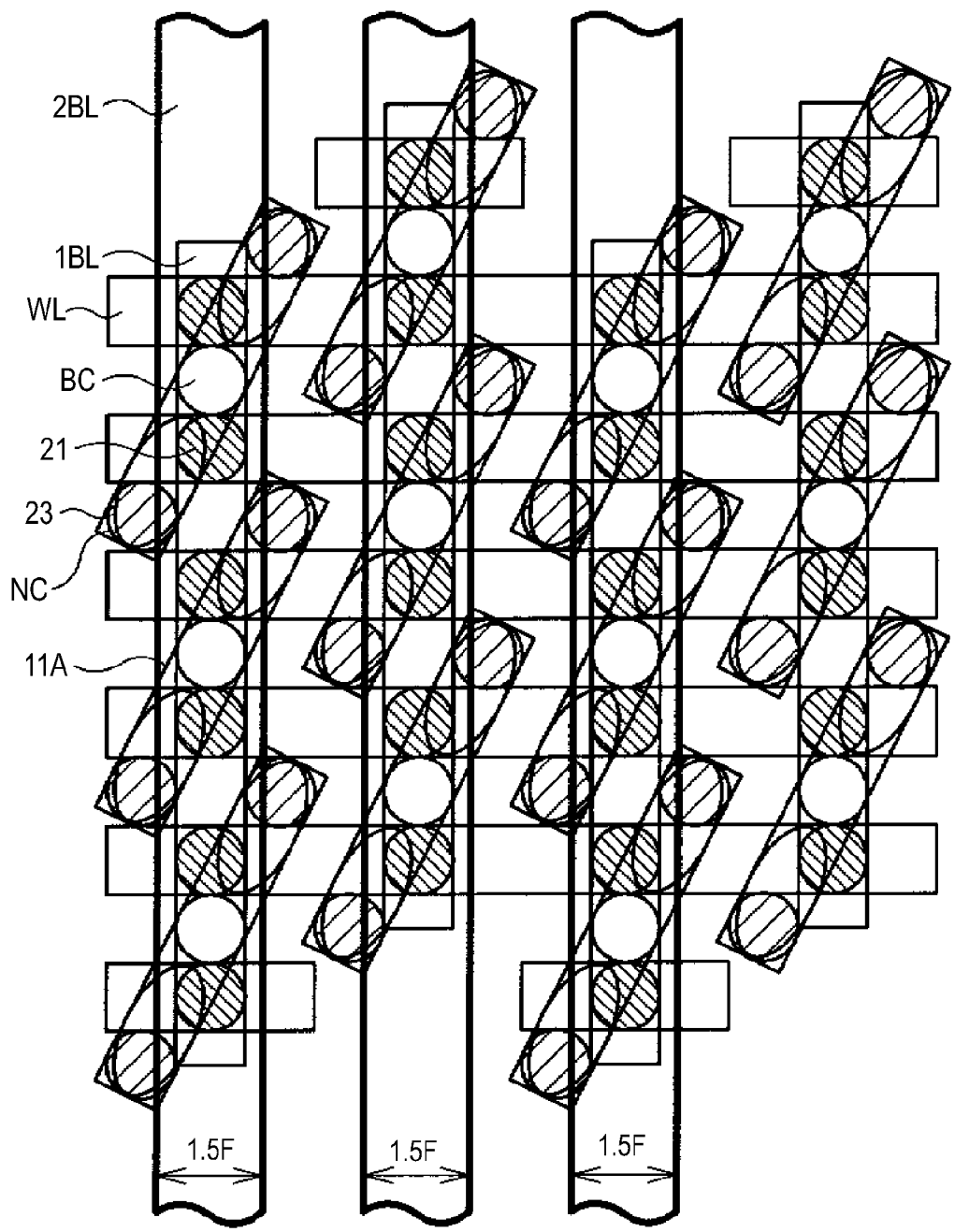
FIG. 11 is a plan view showing a configuration of a memory device according to a second embodiment of the present disclosure.

FIG. 11 shows a planar configuration of a memory device 1A according to the second embodiment of the present disclosure. The memory device 1A has the same configuration, action, and advantages as those of the first embodiment except that the lower electrodes 21 are arranged in lines in a direction in parallel to the first bit lines 1BL, and may be manufactured in the similar manner.

Figure 12:
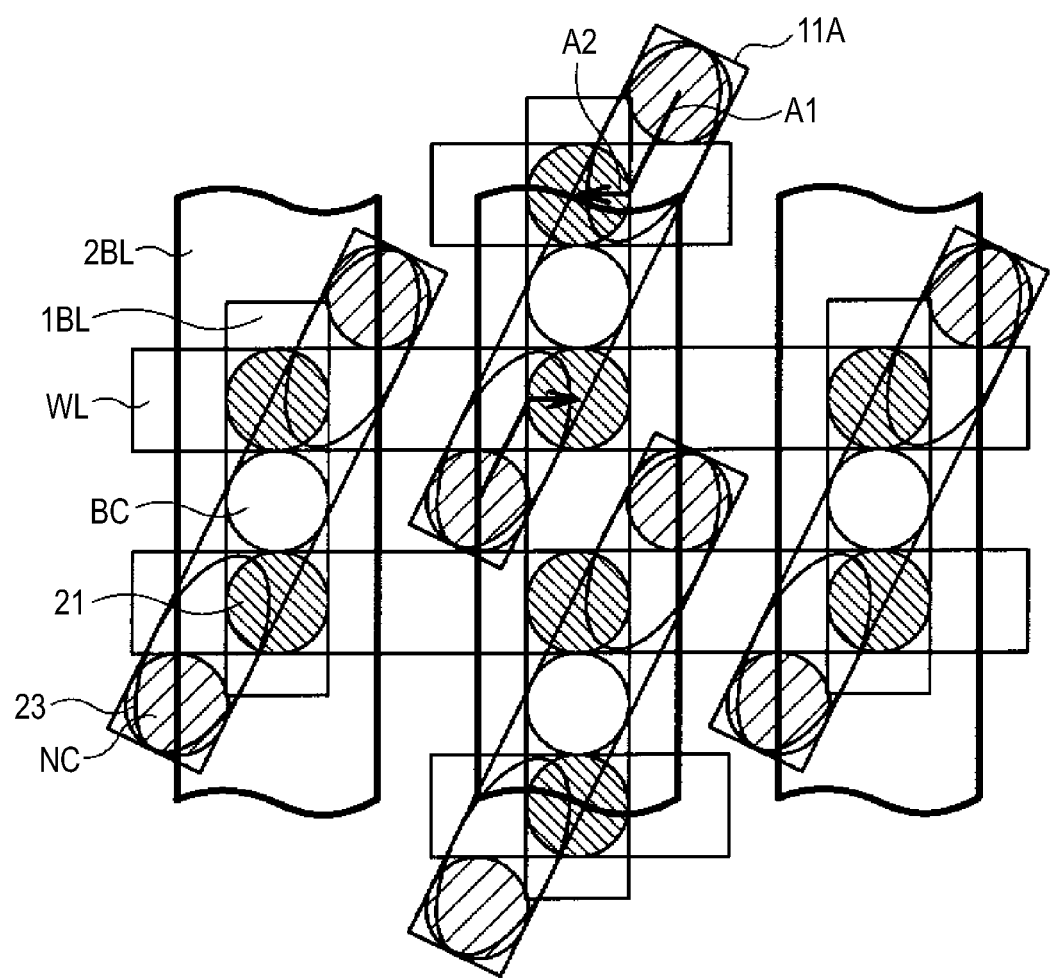
FIG. 12 is a plan view for explanation of directions in which lower electrodes are shifted.

The lower electrodes 21 are provided in positions further shifted by a half of the minimum design rule F (F/2) in directions in parallel to the word lines WL from the positions shifted from immediate above the node contact electrodes NC closer to the bit contact electrodes BC within a plane in parallel to the surface of the substrate 11 as shown by arrows A2 in FIG. 12. The directions A2 in which the lower electrodes 21 are shifted are in parallel to the word lines WL and opposite in alternate columns. In the configuration, the lower electrodes 21 come under the second bit lines 2BL with some room. Accordingly, even when misalignment occurs at patterning of the second bit lines 2BL, device characteristics may not be affected. Note that the width of the second bit lines 2BL shown in FIG. 12 is twice the minimum design rule F (2F) and the distance between the adjacent second bit lines 2BL is made equal to the minimum design rule F, however, if the width of the second bit lines 2BL is made narrower in a range that may compensate for the shifts of superimposition, the distance between the adjacent second bit lines 2BL may be made wider and the occurrence frequency of process failures may be reduced. For example, as shown in FIG. 11, the width of the second bit lines 2BL maybe set to 1.5 times the minimum design rule F (1.5F) and the distance between the adjacent second bit lines 2BL may be set to 1.5 times the minimum design rule F (1.5F).
(Third to Sixth Embodiments)

In the above described first and second embodiments, the cases where the first bit lines 1BL and the second bit lines 2BL have one-to-one relationships have been explained. As below, the third to sixth embodiments relate to examples in which the correspondence relationships between the first bit lines 1BL and the second bit lines 2BL are changed.
(Third Embodiment)

Figure 13:
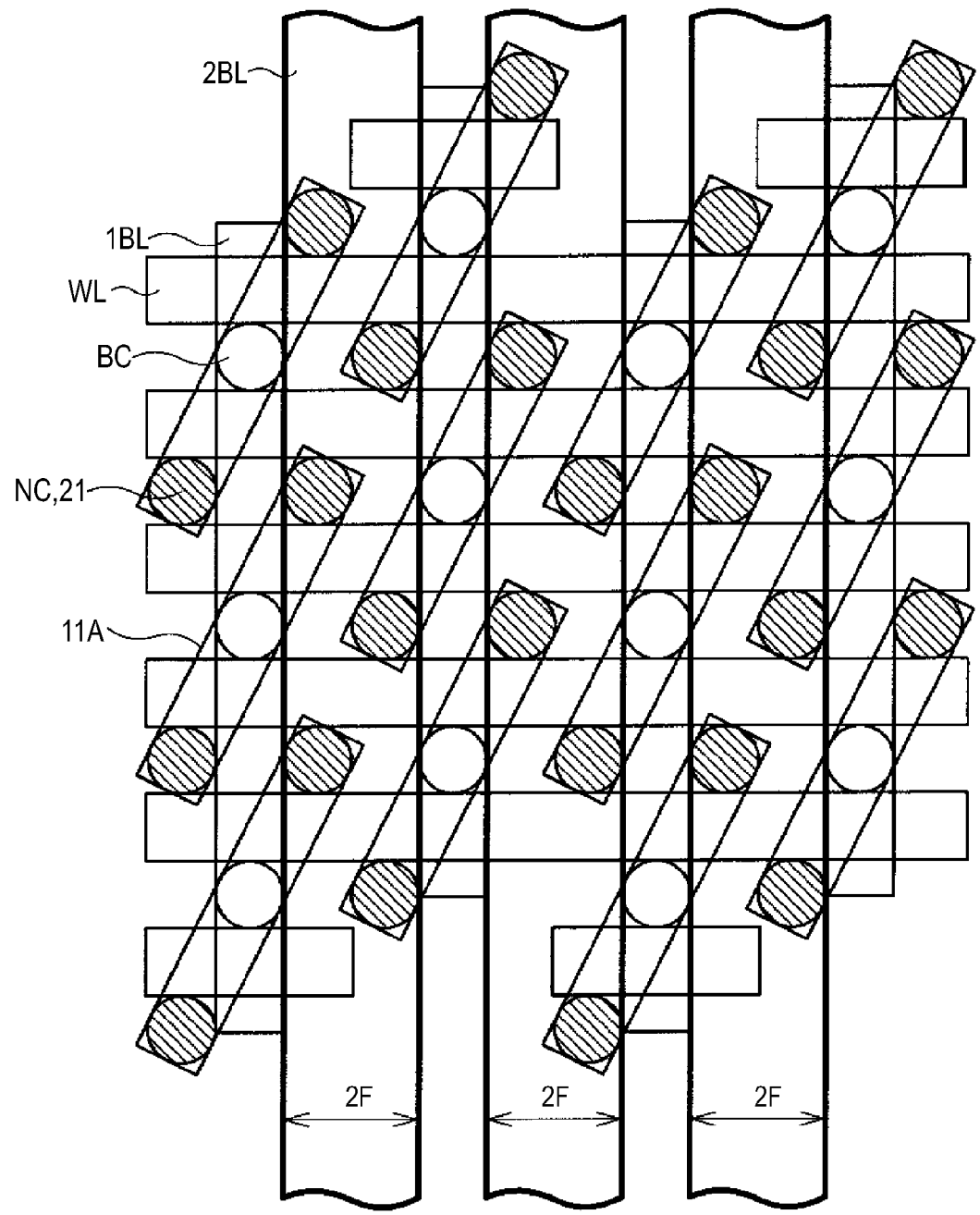
FIG. 13 is a plan view showing a configuration of a memory device according to a third embodiment of the present disclosure.
Figure 14:
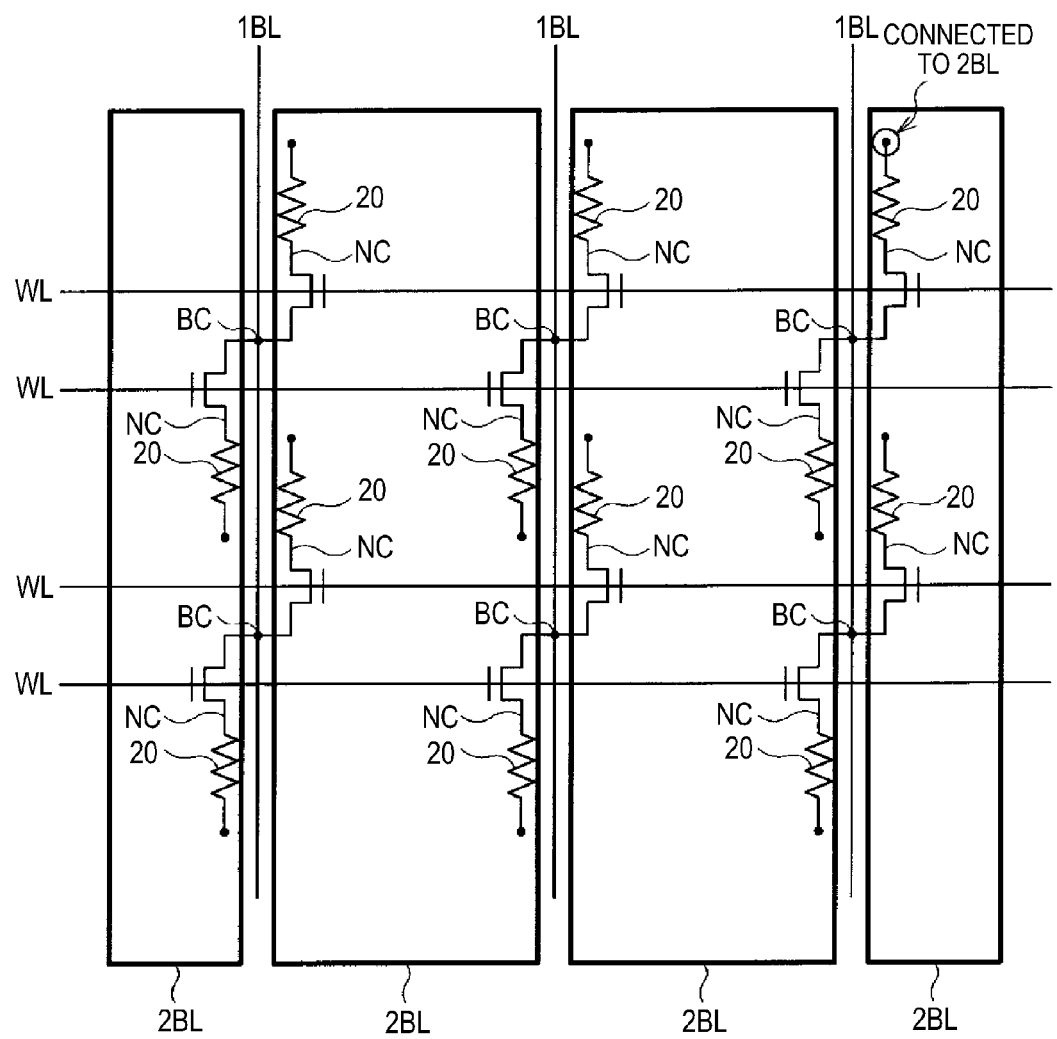
FIG. 14 is an equivalent circuit diagram of the memory device shown in FIG. 13.

FIG. 13 is shows a planar configuration of a memory device 1B according to the third embodiment of the present disclosure, and FIG. 14 shows an equivalent circuit thereof. In the memory device 1B, the lower electrodes 21 attached to adjacent two first bit lines 1BL share one second bit line 2BL. In other words, the lower electrodes 21 attached to the right sides of the same first bit lines 1BL and the lower electrodes 21 attached to the left sides are provided under the different second bit lines 2BL. Except that, the memory device 1B has the same configuration, action, and advantages as those of the first embodiment, and may be manufactured in the similar manner.

In the embodiment, the respective plural second bit lines 2BL are superimposed on the lower electrodes 21 connected to the node contact electrodes NC located between adjacent two first bit lines 1BL. In other words, the lower electrodes 21 connected to the node contact electrodes NC at the right sides of the left first bit line 1BL and the lower electrodes 21 connected to the node contact electrodes NC at the left sides of the right first bit line 1BL of the adjacent two first bit lines 1BL are provided under the same second bit lines 2BL. Thereby, the shapes of the second bit lines 2BL are simplified without shifts of the positions of the lower electrodes 21. Therefore, the second bit lines 2BL can be provided with the area per transistor of $6F^2$ kept.

The operation of the memory device 1B is the same as that of the first embodiment.
(Fourth Embodiment)

Figure 15:
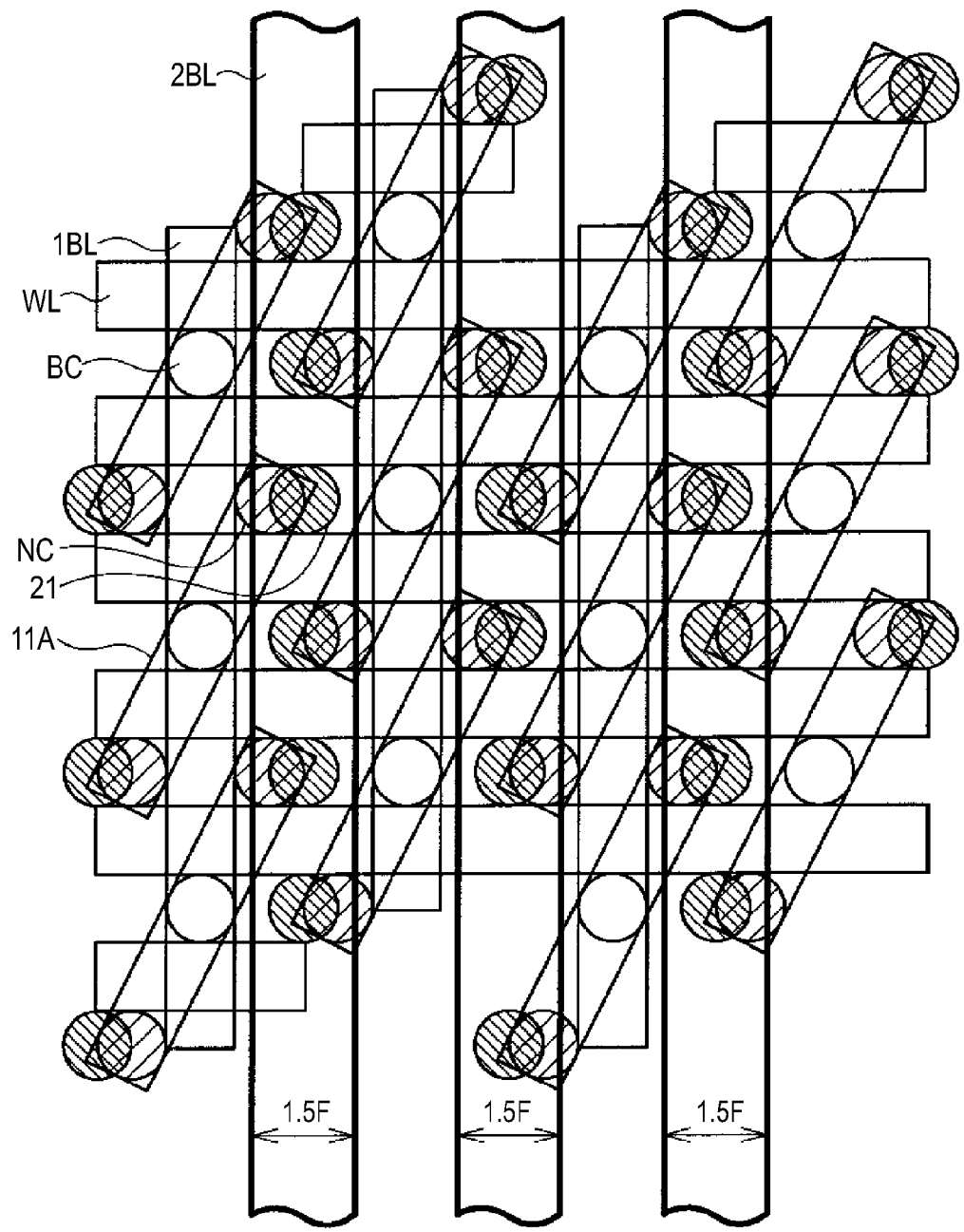
FIG. 15 is a plan view showing a configuration of a memory device according to a fourth embodiment of the present disclosure.

FIG. 15 shows a planar configuration of a memory device 1C according to the fourth embodiment of the present disclosure. In the memory device 1C, the lower electrodes 21 connected to the node contact electrodes NC located between adjacent two first bit lines 1BL are arranged in lines in a direction in parallel to the first bit lines 1BL. Except that, the memory device 1C has the same configuration, action, and advantages as those of the third embodiment, and may be manufactured in the similar manner.

Figure 16:
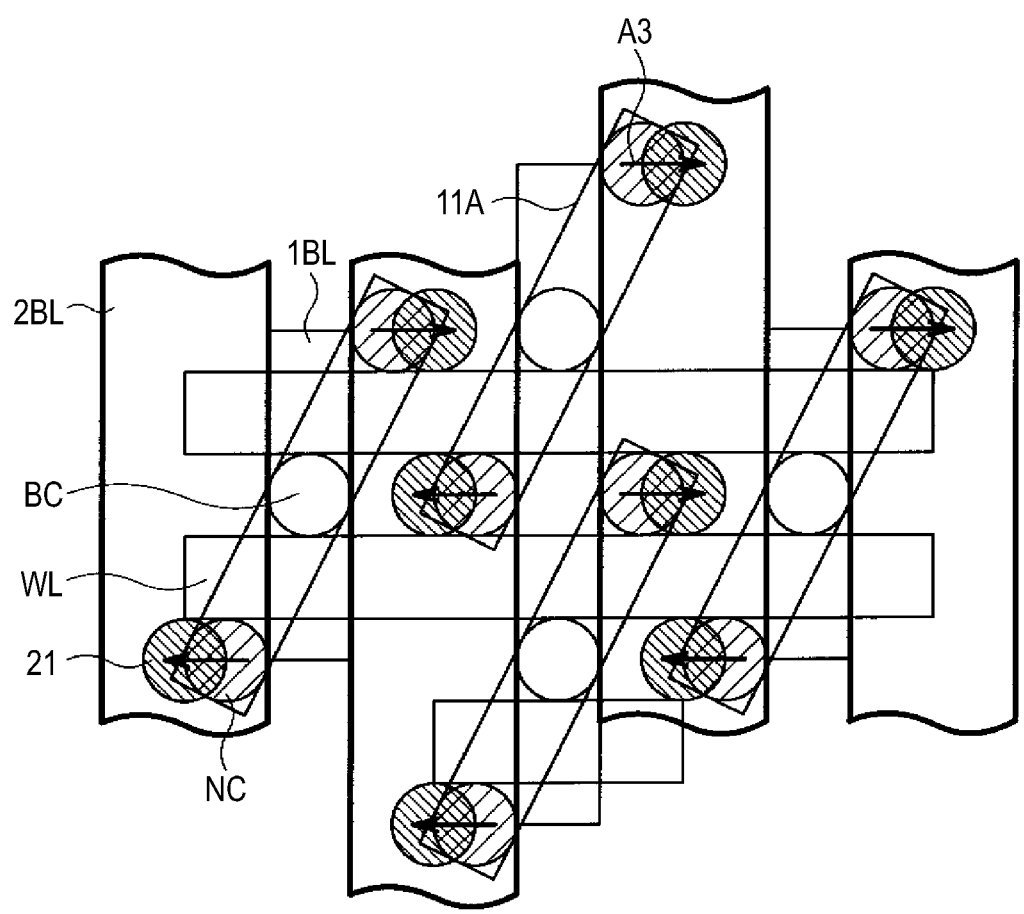
FIG. 16 is a plan view for explanation of directions in which lower electrodes are shifted.

The lower electrodes 21 are provided in positions shifted by a half of the minimum design rule F (F/2) in directions in parallel to the word lines WL within a plane in parallel to the surface of the substrate 11 as shown by arrows A3 in FIG. 16. The directions A3 in which the lower electrodes 21 are shifted are in parallel to the word lines WL and opposite in alternate columns. In the configuration, the lower electrodes 21 come under the second bit lines 2BL with some room. Accordingly, even when misalignment occurs at patterning of the second bit lines 2BL, device characteristics may not be affected. Note that the width of the second bit lines 2BL shown in FIG. 16 is twice the minimum design rule F (2F) and the distance between the adjacent second bit lines 2BL is made equal to the minimum design rule F, however, if the width of the second bit lines 2BL is made narrower in a range that may compensate for the misalignment, the distance between the adjacent second bit lines 2BL may be made wider and the occurrence frequency of process failures may be reduced. For example, as shown in FIG. 15, the width of the second bit lines 2BL may be set to 1.5 times the minimum design rule F (1.5F) and the distance between the adjacent second bit lines 2BL may be set to 1.5 times the minimum design rule F (1.5F).

The configurations of the lower electrodes 21, the node contact electrodes NC, and the connection plugs 14 are the same as those in the first embodiment or the modified examples 1, 2.

(Fifth Embodiment)

Figure 17:
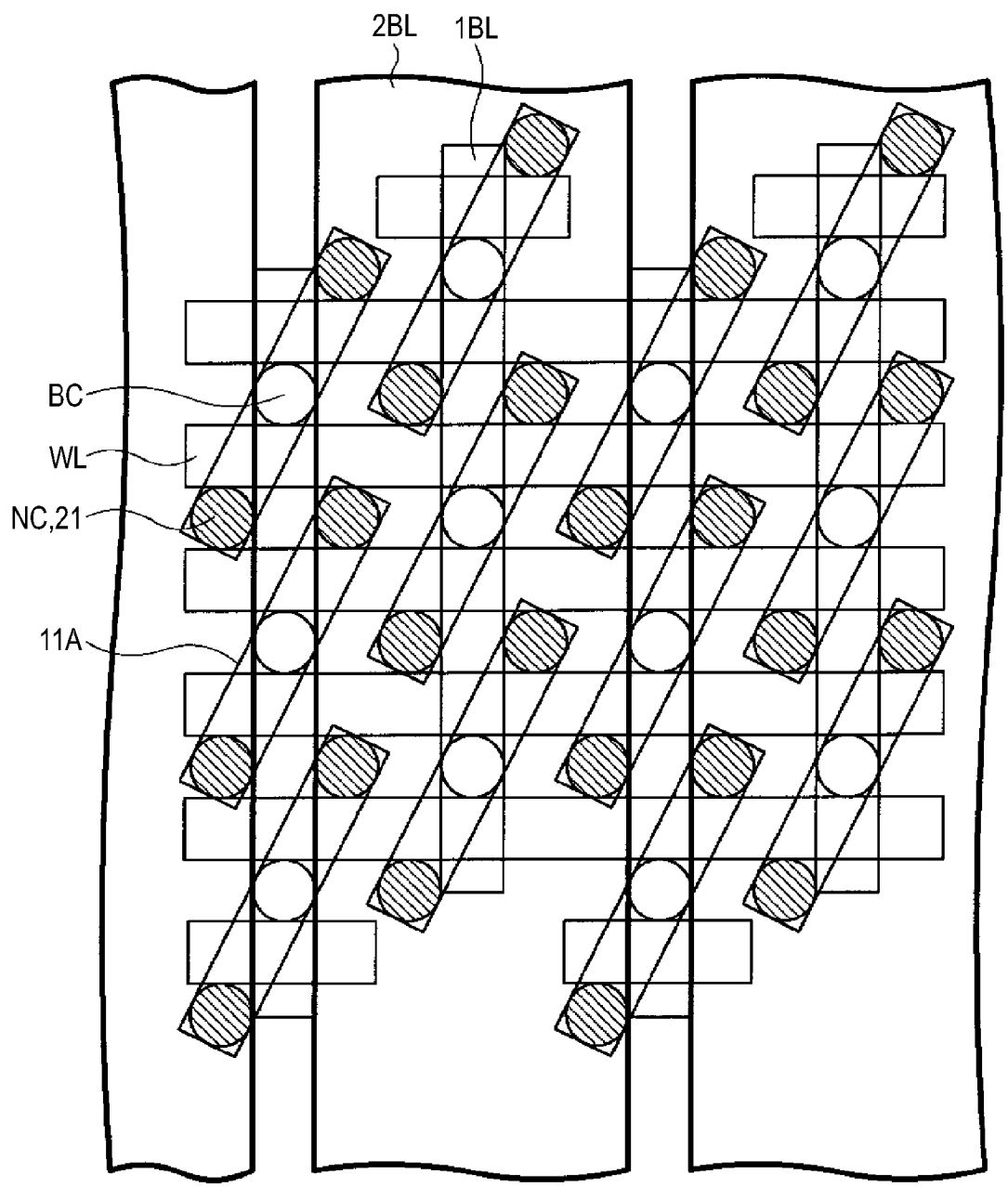
FIG. 17 is a plan view showing a configuration of a memory device according to a fifth embodiment of the present disclosure.
Figure 18:
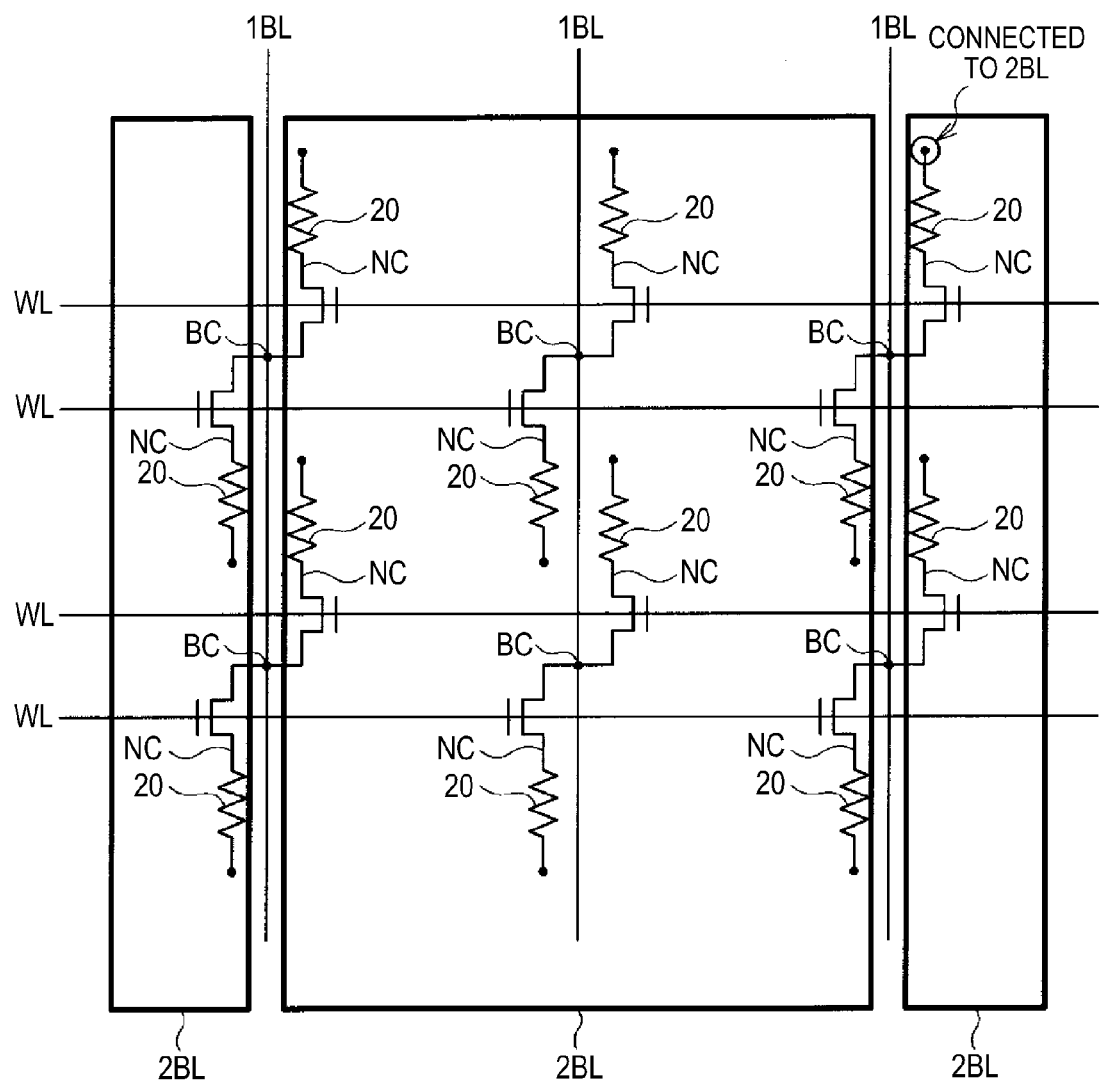
FIG. 18 is an equivalent circuit diagram of the memory device shown in FIG. 17.

FIG. 17 shows a planar configuration of a memory device 1D according to the fifth embodiment of the present disclosure, and FIG. 18 shows an equivalent circuit thereof. The memory device 1D has the same configuration, action, and advantages as those of the first embodiment, and may be manufactured in the similar manner except that one second bit line 2BL to the lower electrodes 21 attached to two first bit lines 1BL are provided.

In the embodiment, the respective plural second bit lines 2BL are superimposed on the lower electrodes 21 connected to the node contact electrodes NC located between first bit lines 1BL at both ends of three adjacent first bit lines 1BL. In other words, the lower electrodes 21 connected to the node contact electrodes NC at both sides of the center first bit lines 1BL of the three adjacent first bit lines 1BL, the lower electrodes 21 connected to the node contact electrodes NC at the right sides of the left first bit line 1BL, and the lower electrodes 21 connected to the node contact electrodes NC at the left sides of the right first bit line 1BL are provided under the same second bit lines 2BL. Thereby, the shapes of the second bit lines 2BL are simplified without shifts of the positions of the lower electrodes 21. Therefore, the second bit lines 2BL can be provided with the area per transistor of $6F^2$ kept. Further, the width of the second bit lines 2BL can be made wider and processing becomes easier, and the occurrence frequency of process failures may be reduced.

In the memory device 1D, when a voltage is applied only to an arbitrary one memory element 20, it is necessary to make the first bit lines 1BL nearby at the same potentials as those of the second bit lines 2BL so that the voltages may not be applied to the other memory elements 20. As below, the respective cases will be explained. Note that the lines other than the first bit lines 1BL and the second bit lines 2BL referred to in the following explanation are set at the ground (GND) potential.

First, when the resistances of the memory elements 20 connected to the left first bit line 1BL are made lower, the second bit lines 2BL and the center first bit line 1BL are set at +V and, at the same time, corresponding word lines WL are activated. When the resistances are made higher, the left first bit line 1BL is set at +V and, at the same time, corresponding word lines WL are activated.

Next, when the resistances of the memory elements 20 connected to the left side of the center first bit line 1BL are made lower, the second bit lines 2BL and the right first bit line 1BL are set at +V and, at the same time, corresponding word lines WL are activated. When the resistances are made higher, the center first bit line 1BL is set at +V and, at the same time, corresponding word lines WL are activated.

When the resistances of the memory elements 20 connected to the right side of the center first bit line 1BL are made lower, the second bit lines 2BL and the left first bit line 1BL are set at +V and, at the same time, corresponding word lines WL are activated. When the resistances are made higher, the center first bit line 1BL is set at +V and, at the same time, corresponding word lines WL are activated.

When the resistances of the memory elements 20 connected to the right first bit line 1BL are made lower, the second bit lines 2BL and the center first bit line 1BL are set at +V and, at the same time, corresponding word lines WL are activated. When the resistances are made higher, the right first bit line 1BL is set at +V and, at the same time, corresponding word lines WL are activated.

That is, in the embodiment, the resistance values of the selected memory elements 20 are changed by setting the first bit lines 1BL to which the lower electrodes 21 of the other memory element 20 sharing the word lines WL and the second bit lines 2BL with the selected memory elements 20 and the shared second bit lines 2BL at the same potentials. Except that, the driving method of the memory device 1D of the embodiment is the same as that of the first embodiment.

(Sixth Embodiment)

Figure 19:
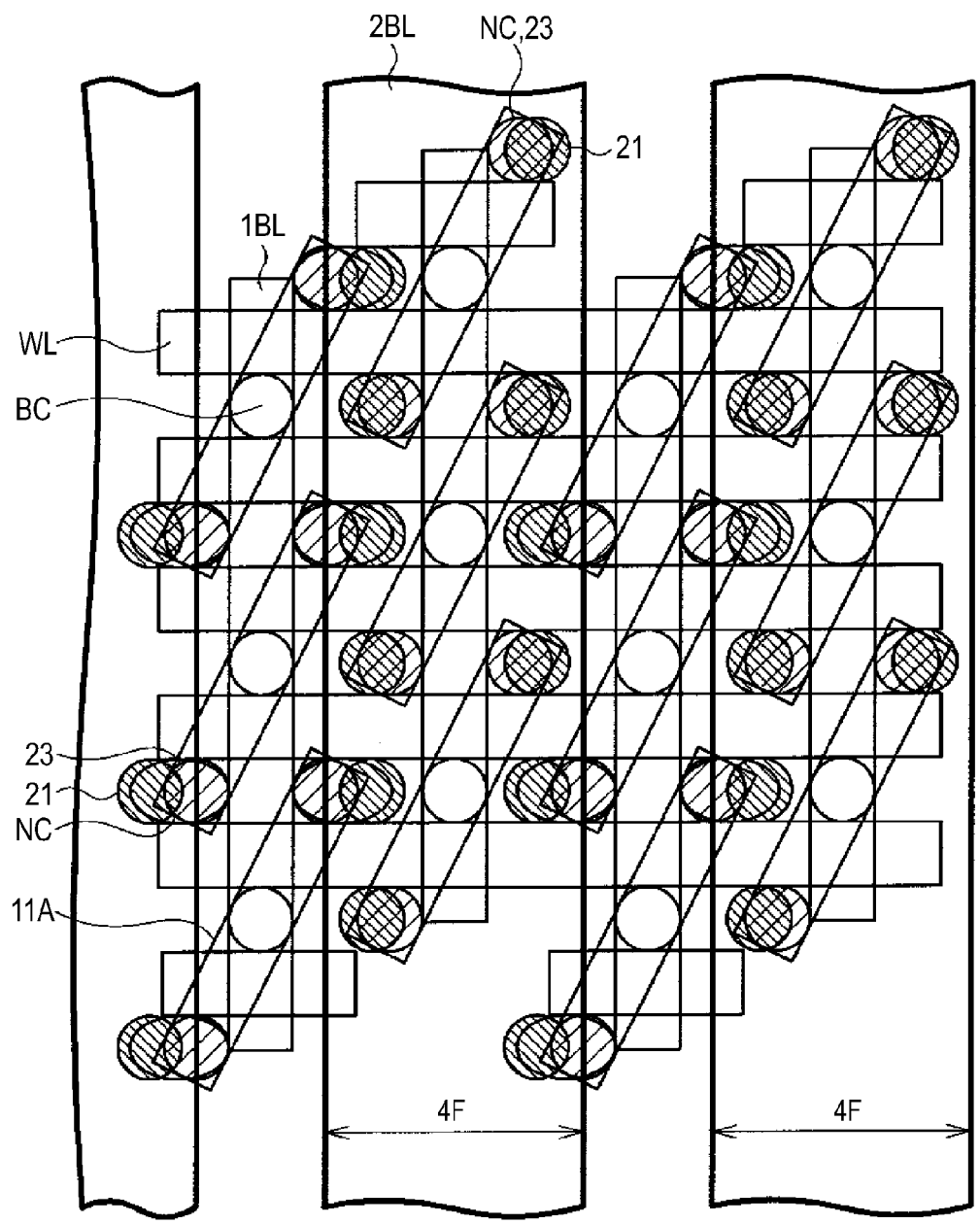
FIG. 19 is a plan view showing a configuration of a memory device according to a sixth embodiment of the present disclosure.

FIG. 19 shows a planar configuration of a memory device 1E according to the sixth embodiment of the present disclosure. In the memory device 1E, the lower electrodes 21 connected to the node contact electrodes NC located between first bit lines 1BL at both ends of three adjacent first bit lines 1BL are arranged in two lines in a direction in parallel to the first bit lines 1BL. Except that, the memory device 1E has the same configuration, action, and advantages as those of the fifth embodiment, and may be manufactured in the similar manner.

Figure 20:
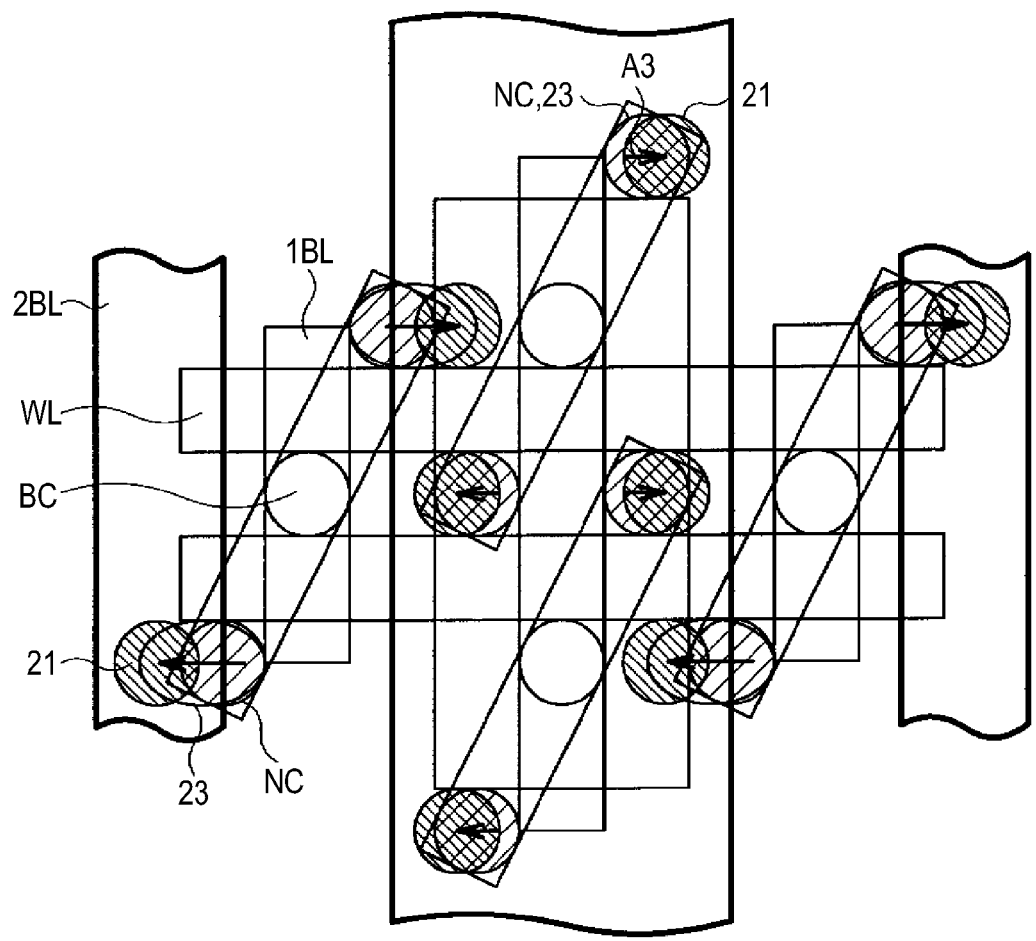
FIG. 20 is a plan view for explanation of directions in which lower electrodes are shifted.

The lower electrodes 21 are provided in positions shifted in a direction in parallel to the word lines WL within a plane in parallel to the surface of the substrate 11 as shown by arrows A3 in FIG. 20. The directions A3 in which the lower electrodes 21 are shifted are in parallel to the word lines WL and opposite in alternate columns. In the configuration, the lower electrodes 21 come under the second bit lines 2BL with some room. Accordingly, even when misalignment occurs at patterning of the second bit lines 2BL, device characteristics may not be affected. Further, the distance between the adjacent second bit lines 2BL may be made wider and the occurrence frequency of process failures may be reduced. Note that the width of the second bit lines 2BL shown in FIG. 20 is four times the minimum design rule F (4F) and the distance between the adjacent second bit lines 2BL is twice the minimum design rule F (2F).

The configurations of the lower electrodes 21, the node contact electrodes NC, and the connection plugs 14 are the same as those in the first embodiment or the modified examples 1, 2.

(Seventh Embodiment)

Figure 21:
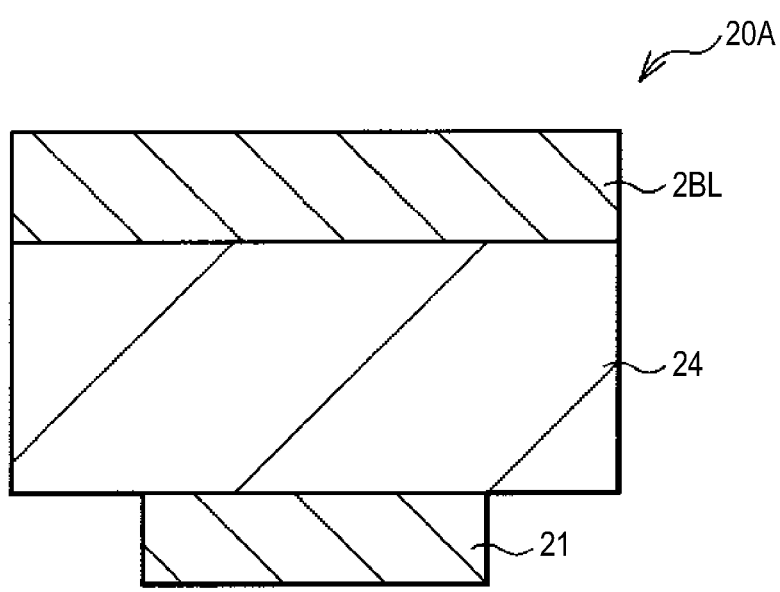
FIG. 21 is a plan view showing a configuration of a memory device according to a seventh embodiment of the present disclosure.

FIG. 21 shows a configuration of a memory element 20A of the memory device 1 according to the seventh embodiment of the present disclosure. The memory device 1 has the same configuration, action, and advantages of those of the first embodiment except that the memory element 20A includes a PCM (Phase Change Memory), and may be manufactured in the similar manner to that of the first embodiment. Thus, the same signs are assigned to the corresponding component elements for explanation.

The memory element 20A is a PCM having a memory layer 24 of a GeSbTe alloy such as $Ge_2Sb_3Te_5$ between a lower electrode 21 and a second bit line 2BL. In the memory layer 24, phase change is produced between the crystalline state and the non-crystalline state (amorphous state) by current application, and the resistance value reversibly changes with the phase change.

In the memory device 1, both potentials of the first bit lines 1BL and the second bit lines 2BL are complementarily changed to Vc or GND, and the voltages of +Vc or −Vc are applied from a power supply (pulse applying means, not shown) between the lower electrodes 21 of the memory elements 20 and the second bit lines 2BL and the memory layers 24 change from the non-crystalline state with high resistance to the crystalline state with low resistance (or from the crystalline state with low resistance to the non-crystalline state with high resistance). By repeating the processes, writing of information in the memory elements 20A and erasing of the written information may be repeatedly performed.

(Eighth Embodiment)

Figure 22:
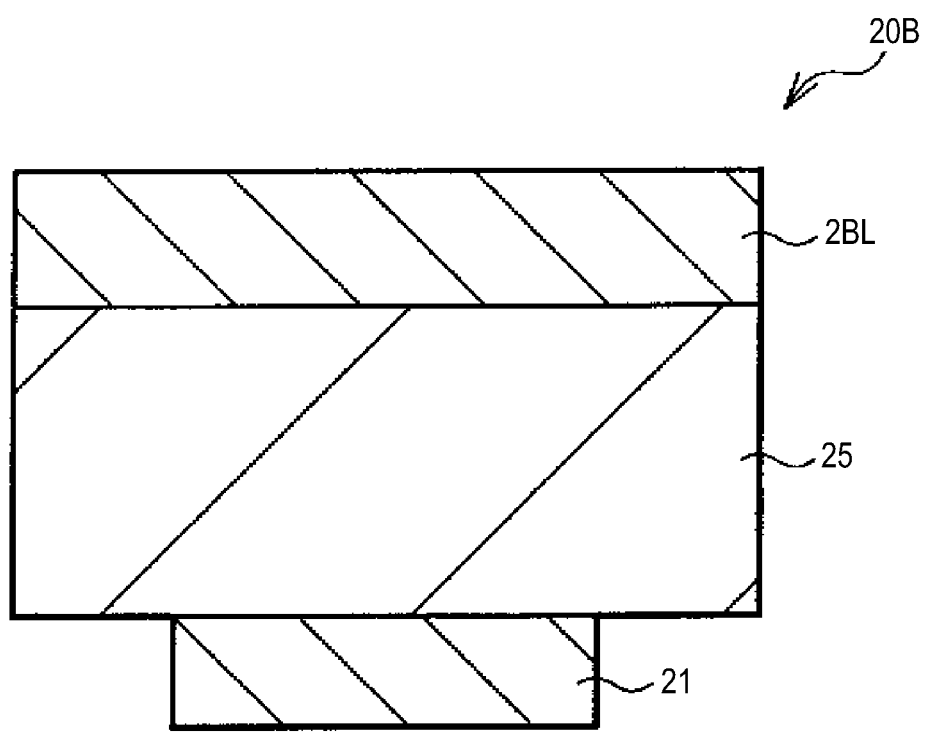
FIG. 22 is a plan view showing a configuration of a memory device according to an eighth embodiment of the present disclosure.

FIG. 22 shows a configuration of a memory device 20B of the memory device 1 according to the eighth embodiment of the present disclosure. The memory device 1 has the same configuration, action, and advantages of those of the first embodiment except that a memory element 20B includes a ReRAM (Resistive Random Access Memory), and may be manufactured in the similar manner. Thus, the same signs are assigned to the corresponding component elements for explanation.

The memory element 20B is a ReRAM having a memory layer 25 of an oxide such as an NiO, $TiO_2$, $PrCaMnO_3$, or the like between a lower electrode 21 and the second bit line 2BL, and its resistance value reversibly changes by voltage application to the oxide.

In the memory device 1, both potentials of the first bit lines 1BL and the second bit lines 2BL are complementarily changed to Vc or GND, and the voltages of +Vc or −Vc are applied from a power supply (pulse applying means, not shown) between the lower electrodes 21 of the memory elements 20 and the second bit lines 2BL, and the memory layers 25 change from the high-resistance state to the low-resistance state (or from the low-resistance state to the high-resistance state). By repeating the processes, writing of information in the memory elements 20B and erasing of the written information may be repeatedly performed.

As above, the present disclosure has been explained with reference to the embodiments, however, the present disclosure is not limited to the embodiments, but various changes may be made.

For example, the materials of the respective layers explained in the embodiments, or the deposition methods and deposition conditions are not limited, but other materials or other deposition methods may be used. For example, in the first embodiment, other transition metal elements, for example, titanium (Ti), hafnium (Hf), vanadium (V), niobium (Nb), tantalum (Ta), chromium (Cr), molybdenum (Mo), or tungsten (W) may be added to the ion source layer 22B. Further, nickel (Ni) or the like other than copper (Cu), silver (Ag) or zinc (Zn) may be added.

Furthermore, for example, in the embodiments, the configurations of the memory elements 20, 20A, 20B and memory devices 1, 1A to 1E have been explained by specific citation, however, it is not necessary to provide all of the layers or other layers may be further provided.

The present disclosure contains subject matter related to that disclosed in Japanese Priority Patent Application JP 2010-259379 filed in the Japan Patent Office on Nov. 19, 2010, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A memory device comprising:
   a transistor array having plural transistors; and
   plural memory elements provided, one for each of the plural transistors, wherein,
   the transistor array includes (a) a substrate having diffusion layers of the plural transistors on a surface thereof, (b) plural parallel word lines on the substrate, (c) plural parallel first bit lines provided in a direction perpendicular to the word lines, (d) bit contact electrodes provided between the adjacent two word lines and connecting the first bit lines and the diffusion layers, and (e) node contact electrodes provided at an opposite side to the bit contact electrodes with the respective adjacent two word lines in between and connected to the diffusion layers;
   the plural memory elements have (a) lower electrodes connected to the node contact electrodes and provided with respect to each of the plural memory elements in positions shifted from immediate above the node contact electrodes closer to the bit contact electrodes within a plane in parallel to the surface of the substrate, (b) memory layers provided on the lower electrodes and having resistance values reversibly changing by voltage application, and (c) plural parallel second bit lines extending in the same direction as that of the first bit lines on the memory layers; and
   the respective plural second bit lines are superimposed on the lower electrodes connected to the node contact electrodes at both sides of the first bit lines.

2. The memory device according to claim 1, wherein the lower electrodes connected to the node contact electrodes at both sides of the first bit lines are arranged in lines in a direction in parallel to the first bit lines.

3. The memory device according to claim 2, wherein connection layers are provided between the node contact electrode and the lower electrodes, and the connection layers have shapes that can absorb amounts of shifts between the node contact electrodes and the lower electrodes.

4. The memory device according to claim 1, wherein connection plugs are provided between the node contact electrodes and the diffusion layers, and the node contact electrode has a larger diameter than that of the connection plugs.

5. The memory device according to claim 1, wherein connection plugs are provided between the node contact electrodes and the diffusion layers, and the connection plugs, the node contact electrodes, and the lower electrodes are sequentially shifted and stacked from the connection plugs toward the lower electrode side.

6. A memory device comprising:
   a transistor array having plural transistors; and
   plural memory elements provided, one for each of the plural transistors wherein,
   the transistor array includes (a) a substrate having diffusion layers of the plural transistors on a surface thereof, (b) plural parallel word lines on the substrate, (c) plural parallel first bit lines provided in a direction perpendicular to the word lines, (d) bit contact electrodes provided between the adjacent two word lines and connecting the first bit lines and the diffusion layers, and (e) node contact electrodes provided at an opposite side to the bit contact electrodes with the respective adjacent two word lines in between and connected to the diffusion layers;

the plural memory elements have (a) lower electrodes connected to the node contact electrodes and provided with respect to each of the plural memory elements, (b) memory layers provided on the lower electrodes and having resistance values reversibly changing by voltage application, and (d) plural parallel second bit lines extending in the same direction as that of the first bit lines on the memory layers; and the respective plural second bit lines are superimposed on the lower electrodes connected to the node contact electrodes located between the adjacent two first bit lines.

7. The memory device according to claim 6, wherein the lower electrodes connected to the node contact electrode located between the adjacent two first bit lines are provided in positions shifted in a direction in parallel to the word lines within a plane in parallel to the surface of the substrate, and arranged in lines in a direction in parallel to the first bit lines.

8. The memory device according to claim 7, wherein connection layers are provided between the node contact electrode and the lower electrodes, and the connection layers have shapes that can absorb amounts of shifts between the node contact electrodes and the lower electrodes.

9. The memory device according to claim 7, wherein connection plugs are provided between the node contact electrodes and the diffusion layers, and the node contact electrodes have a larger diameter than that of the connection plugs.

10. The memory device according to claim 7, wherein connection plugs are provided between the node contact electrodes and the diffusion layers, and the connection plugs, the node contact electrodes, and the lower electrodes are sequentially shifted and stacked from the connection plugs toward the lower electrode side.

11. A memory device comprising:
a transistor array having plural transistors; and
plural memory elements provided, one for each of the plural transistors, wherein,
the transistor array includes (a) a substrate having diffusion layers of the plural transistors on a surface thereof, (b) plural parallel word lines on the substrate, (c) plural parallel first bit lines provided in a direction perpendicular to the word lines, (d) bit contact electrodes provided between the adjacent two word lines and connecting the first bit lines and the diffusion layers, and (e) node contact electrodes provided at an opposite side to the bit contact electrodes with the respective adjacent two word lines in between and connected to the diffusion layers;
the plural memory elements have (a) lower electrodes connected to the node contact electrodes and provided with respect to each of the plural memory elements, (b) memory layers provided on the lower electrodes and having resistance values reversibly changing by voltage application, and (c) plural parallel second bit lines extending in the same direction as that of the first bit lines on the memory layers; and
the respective plural second bit lines are superimposed on the lower electrodes connected to the node contact electrodes located between the first bit lines at both ends of the adjacent three first bit lines.

12. The memory device according to claim 11, wherein the lower electrodes connected to the node contact electrode located between the first bit lines at both ends of the adjacent three first bit lines are provided in positions shifted in a direction in parallel to the word lines within a plane in parallel to the surface of the substrate, and arranged in two lines in a direction in parallel to the first bit lines.

13. The memory device according to claim 11, wherein resistance values of selected memory elements are changed by setting the first bit lines to which the lower electrodes of other memory elements sharing the word lines and the second bit lines with the selected memory elements and the shared second bit lines at the same potentials.

14. The memory device according to claim 13, wherein connection layers are provided between the node contact electrodes and the lower electrodes, and the connection layers have shapes that can absorb amounts of shifts between the node contact electrodes and the lower electrodes.

15. The memory device according to claim 13, wherein connection plugs are provided between the node contact electrodes and the diffusion layers, and the node contact electrodes have a larger diameter than that of the connection plugs.

16. The memory device according to claim 13, wherein connection plugs are provided between the node contact electrodes and the diffusion layers, and the connection plugs, the node contact electrodes, and the lower electrodes are sequentially shifted and stacked from the connection plugs toward the lower electrode side.

* * * * *